United States Patent [19]
Sato

[11] Patent Number: 5,726,879
[45] Date of Patent: Mar. 10, 1998

[54] CONTROL APPARATUS, A STAGE APPARATUS AND A HARD DISK SERVO WRITER APPARATUS INCLUDING A ROBUST STABILIZING COMPENSATOR

[75] Inventor: Mikio Sato, Utsunomiya, Japan

[73] Assignee: Canon Kabushiki Kaisha, Tokyo, Japan

[21] Appl. No.: 401,677

[22] Filed: Mar. 10, 1995

[30] Foreign Application Priority Data

Mar. 14, 1994 [JP] Japan ................... 6-042458

[51] Int. Cl.⁶ .................. G05B 19/18; G11B 21/02
[52] U.S. Cl. .................. 364/167.01; 364/157; 364/176; 364/159; 360/75; 318/561
[58] Field of Search .................... 364/148–151, 364/158–163, 166–177; 318/561, 609–611, 621; 360/75

[56] References Cited

U.S. PATENT DOCUMENTS

| | | |
|---|---|---|
| 4,214,300 | 7/1980 | Barlow et al. ............ 364/159 |
| 4,451,878 | 5/1984 | Shigemasa ............ 364/159 |
| 4,679,136 | 7/1987 | Shigemasa ............ 364/157 |
| 4,769,766 | 9/1988 | Tsung ............ 364/157 |
| 5,306,994 | 4/1994 | Supino ............ 364/159 |
| 5,394,322 | 2/1995 | Hansen ............ 364/157 |
| 5,406,496 | 4/1995 | Quinn ............ 364/159 |
| 5,453,925 | 9/1995 | Wojsznis et al. ............ 364/177 |

OTHER PUBLICATIONS

"Robust Control in Automatic Industry", Oba and Kuraoka, Aug., 1991, vol. 30, No. 8, Journal of the Society of Instrument and Control Engineers, pp. 701–705.

Fundamental Theories for Automatic Control, Revised, Masubuchi, 1964, pp. 178–185.

*Primary Examiner*—Reba I. Elmore
*Assistant Examiner*—Steven R. Garland
*Attorney, Agent, or Firm*—Fitzpatrick, Cella, Harper & Scinto

[57] ABSTRACT

Provided is high-performance $H_\infty$ control technology suitable for position control or speed control of semiconductor exposure apparatus, servo writer of hard disk, etc. A series compensator in the classical control technology represented by the PID compensator is employed as a frequency weight of loop shaping, whereby the design technology in the conventional classical control can be succeeded to and a high-performance control system can be realized even for cases where there is an oscillation mode of a controlled object to become a problem on control performance in the servo band, which was difficult to realize by the classical control technology. Also, using a robust stabilizing compensator obtained from a generalized plant having constant matrix weights, a high-performance control system can be realized even for cases where there is an oscillation mode of the controlled object to become a problem on control performance in the servo band, which was difficult to realize by the conventional classical control technology.

17 Claims, 18 Drawing Sheets

FREQUENCY CHARACTERISTICS OF CONTROLLED OBJECT (GAIN)

POLE AND ZERO OF CONTROLLED OBJECT (S PLANE)

FREQUENCY CHARACTERISTICS OF COMPENSATOR (GAIN)

POLE AND ZERO OF COMPENSATOR (S PLANE)

CONTROL APPARATUS, A STAGE APPARATUS AND A HARD DISK SERVO WRITER APPARATUS INCLUDING A ROBUST STABILIZING COMPENSATOR

BACKGROUND OF THE INVENTION

1. Field of the Invention

The present invention relates to a control apparatus of a controlled body, and more particularly to a control apparatus suitably applicable to the control of the position or speed of an exposure apparatus for fabricating semiconductors, such as steppers, servo writers of a fixed disk, robots, etc.

2. Related Background Art

As industrial devices or information devices become more complex, more sophisticated, and finer, the control technique necessary for controlling them also becomes more precise and operates at a higher speed. With an example of the so-called stepper, which is an exposure apparatus of the step-and-repeat type for fabricating semiconductors, the required accuracy of positioning control at present is some tens of nanometers because of the recent, rapid progress in the development of semiconductor devices. It is anticipated that positioning accuracy of the order of some nanometer will become necessary within a few years. In addition, such high-accuracy positioning control needs to be performed at a higher speed in order to improve the throughput.

Most of the control techniques presently used in such high-performance control apparatus are still control techniques based on the so-called "classical control theory" represented by PID control. The control technique based on classical control theory has a typical feature that it basically requires no model of the controlled object, because the design can be made based on measured data in the frequency region represented by Bode diagrams.

In addition to the classical control theory, a control technique using the so-called "modern control theory" has also been proposed in order to meet the need for control technology that operates at higher and higher speeds and has higher and higher accuracy year by year. Modern control theory takes account of the internal states of the system that have been excluded from classical control theory, and an optical control theory is constructed with new concepts of controllability and observability. These are important products of the modern control theory.

Modern control theory up to the 70s, however, had a drawback that frequency characteristics were little taken into consideration. As evident in view of the gain margin and phase margin in classical control theory, to take the frequency characteristics into account is indispensable to designing a stable control system, and a control technique without consideration of them would result in forming a control system that is not robust or does not have so-called "robustness" against uncertainty of the controlled object.

Thus, the "robust control theory" taking the uncertainty of the controlled object into account is being developed while solving the problem in modern control theory. Particularly, it is clarified that a control method, assuming the worst case of uncertainty and designed to stabilize a control system under the worst circumstances, can be achieved by solving the so-called "$H_\infty$ control problem" to obtain a stabilizing compensator that minimizes a related $H_\infty$ norm for the uncertainty-assumed model, and the theoretical development thereof is in progress. Although a solution to the $H_\infty$ control problem was initially considered as difficult, a solving algorithm (a method for solving two Riccati equations) was established for the "standard $H_\infty$ control problem" as detailed below, and became easily computed with the recent rapid progress in computer technology.

Since the $H_\infty$ control covers very wide regions as the "control problem to minimize the $H_\infty$ norm," the standard $H_\infty$ control problem systemically handles them and provides a framework for systematically obtaining design methods for them.

"Generalized plant" is a state-space representation including a model of a controlled object for the standard problem. Specifically, FIG. 2 shows the "generalized plant" where the state equations of input and output signals which are given by Equation (1), consist of an exogenous input w, a control input u, a control output z, and an observation output y. With such a "generalized plant", the standard $H_\infty$ control problem is to obtain a stabilizing compensator K(s) that can make the $H_\infty$ norm of from the exogenous input w to the control output z, smaller than γ (<1). Repetitive computations, called a γ-Iteration, are normally used for it.

$$G: \begin{cases} x = Ax + B_1w + B_2u \\ z = C_1x + D_{11}w + D_{12}u \\ y = C_2x + D_{21}w + D_{22}u \end{cases} \quad (1)$$

Conventionally, the most generally used technique in such $H_\infty$ control is a control technique to design and mount the stabilizing compensator by a design method called a "mixed sensitivity problem" (for example, Oba and Kuraoka: robust control in automobile industry, instrumentation and control, 30-8, 701/705 (1991)). The mixed sensitivity problem will be described hereinafter, but the performance generally required for the control system is first described.

FIG. 3 shows a typical control system using a series compensator, wherein r, e, d, n, y, and u represent a desired value signal, a control error, a disturbance input, a detection noise, an output of the controlled object, and a control input, respectively. A first object of the control system is to make the output y quickly follow up the desired value signal r, that is, to enhance a response property to the desired value. This is equivalent to making a characteristic Gyr of from the desired value to the output approach 1 up to regions as high as possible.

However, actually achieved follow-up characteristics are restricted, for example, by disturbances, detection noise, or variations of the controlled object. Accordingly, the design must be made taking indices for such restriction into consideration. Specifically, the "sensitivity function S" and the "complementary sensitivity function T" are given as follows, as indices indicating the characteristics for the disturbance, the detection noise, or variations of the controlled object, i.e., feedback characteristics, and the design was developed taking them into consideration.

$$S(s)=(1+P(s)K(s))^{-1} \quad (2)$$

$$T(s)=P(s)K(s)(1+P(s)K(s))^{-1} \quad (3)$$

Among them, the sensitivity function represents the sensitivity to parameter variations, which is defined as a ratio between the relative variation of a desired value response and the relative variation of the controlled object when a transfer function P(s) of the controlled object changes as in the following equation (where each tilde indicates a variation).

$$S(s) = \frac{(\tilde{G}_{yr} - \tilde{G}_{ur})/G_{yr}}{(\tilde{P} - P)/\tilde{P}} \quad (4)$$

Since the sensitivity function is also a transfer function of from disturbance d to output y as is evident from FIG. 3, the smaller $|S(j\omega)|$, the less the influence of parameter variations on the desired value response and at the same time the better the disturbance removing characteristic.

On the other hand, the complementary sensitivity function T(S) can be considered as an index of robust stability. This arises from the fact that a robust stability condition is given as follows $$\delta_m(\omega)T(j\omega)<1; \quad \forall \omega \quad (6)$$

for a multiplicative variation of the controlled object as given by the following:

$$P(s)=(1+\Delta(s))\tilde{P}(s); \; \Delta(s)<\delta_m(\omega); \; \forall \omega \quad (5)$$

The complementary sensitivity function is also equal to a transfer function of from the detection noise n to the output y. Thus, the requirement to enhance the robust stability is consistent with a requirement to remove the detection noise. From these, it is seen that $|S(j\omega)|$ and $|T(j\omega)|$ need to be decreased in order to improve the feedback characteristics. However, as is evident from Equations (2) and (3), $|S(j\omega)|$ and $|T(j\omega)|$ cannot be made simultaneously small because the following relation holds.

$$S(j\omega)+T(j\omega)\equiv 1 \quad (7)$$

Therefore, a trade-off becomes necessary such that S is set small in a low frequency region where the sensitivity decrease and disturbance suppression are especially important, whereas T is set small in a high frequency region for robust stabilization and detection noise removal because modeling errors and detection noise have a lot of components in the high frequency region.

Then the design to take the trade-off between the sensitivity function and the complementary sensitivity function into consideration is the mixed sensitivity problem, and the generalized plant is constructed by the method as described below. First, loop shaping by the above-described trade-off is quantitatively expressed by Equation (8). This is depicted in FIG. 4.

$$\left. \begin{array}{l} |S(j\omega)| < 1/|W_S(jw)|; \forall \omega \\ |T(j\omega)| < 1/|W_T(j\omega)|; \forall \omega \end{array} \right\} \quad (8)$$

Here, $W_S$ and $W_T$ are weight functions indicating the specifications at each frequency, and $|W_S(j\omega)|$ or $|W_T(j\omega)|$ is set large at a frequency where $|S(j\omega)|$ or $|T(j\omega)|$ is desired to be kept small. These conditions can be rewritten as follows using the $H_\infty$ norm.

$$\left. \begin{array}{l} \|SW_S\|_\infty < 1 \\ \|TW_T\|_\infty < 1 \end{array} \right\} \quad (9)$$

Thus, the generalized plant for the standard $H_\infty$ control problem in the mixed sensitivity problem becomes as shown in FIG. 5. It is clear in the generalized plant of FIG. 5 that the control system with the stabilizing compensator K(s) which makes the $H_\infty$ norm of from the exogenous input w to the control output z smaller than $\gamma$ (<1) satisfied Equation (8).

SUMMARY OF THE INVENTION

The based conventional technology as described above, however, had the following problems.

Problem 1

The control system is required to have such basic specifications as (i) internal stability, (ii) desired transient characteristics, and (iii) desired steady-state characteristics. Another important specification is (iv) robustness that those characteristics are robust against uncertainty of the model of the controlled object or parameter variations.

The conventional $H_\infty$ control technology which addresses the mixed sensitivity problem involves consideration of the internal stability corresponding to the specification (i), the desired transient characteristics corresponding to the specification (ii), and the robustness thereof. It, however, excluded the requirements of the desired steady-state characteristics of specification (iii) and the robustness thereof.

A most typical example of the requirements is to realize a feedback control system without steady-state deviation against a stepwise desired signal or a disturbance input even if there is the uncertainty of the model of the controlled object or parameter variations. Such a control system is called as a "type-one robust control system," which has an integrator in the loop transfer characteristics. This type-one robust servo system is very important in designing many practical control systems. The conventional technology using the design to address the conventional mixed sensitivity problem, however, failed to construct the type-one robust servo system for the following reason. Namely, the following condition (10) must be satisfied as one of the conditions for the standard $H_\infty$ control problem to be solvable:

$$\begin{bmatrix} A-j\omega I & B_2 \\ c_1 & D_{12} \end{bmatrix} \text{ is of a row full rank;} \quad (10)$$

and $$\begin{bmatrix} A-j\omega I & B_1 \\ c_2 & D_{21} \end{bmatrix} \text{ is of a column full rank;}$$

for all $\omega$.

The optimal control often uses a method to construct an expanded system with an integrator added to the controlled object P(s) and to apply the optimal regulator theory to this expanded system. When this method is tried to be applied to the $H_\infty$ control technology by the mixed sensitivity problem, the above condition does not hold because the expanded system has a pole at the origin s=0. Therefore, the standard problem is not solvable for the expanded system including the integrator as produced in the optimal control.

Problem 2

The conventional control technology using the design addressing the mixed sensitivity problem does permit the sensitivity function and complementary sensitivity function to be shaped in accordance with desired characteristics. The control system for addressing the mixed sensitivity problem, however, in fact, employs merely such an arrangement that pole-zero cancellation is effected to cancel a stable pole of the controlled object model against a stable zero of compensator and to cancel a stable zero of the controlled object model against a stable pole of compensator and thereafter shaping is effected to effect desired characteristics with frequency weights $W_S$ and $W_T$. FIGS. 6A, 6B, 6C, and 6D diagrammatically show the pole-zero cancellation.

However, perfect pole-zero cancellation is impossible because of uncertainties of the pole and the zero of the controlled object in actuality. Thus, if the controlled object has a pole or zero near the imaginary axis, which is a poorly damped pole or zero, and if such a pole or zero is uncertain or varies, a poorly damped oscillation mode remains, which caused a problem that the control system becomes poor in positioning characteristics.

This pole-zero cancellation results from the fact that there is a problem in the constitution itself of the mixed sensitivity problem. Namely, as is apparent from FIG. 5, in the mixed sensitivity problem, the exogenous input w is added to the output side of the controlled object and the control output z is observed only on the output side of the controlled object, similarly to w. In other words, there is no restriction on pole-zero cancellation on the input side of the controlled object. In order to prevent such pole-zero cancellation, a restriction on the pole-zero cancellation needs to be set by adding the exogenous input w also to the input side of the controlled object and also increasing the control output z on the input side of the controlled object. However, such a constitution was not able to be handled within the framework of the conventional mixed sensitivity problem.

Problem 3

Most of the control techniques using convention $H_\infty$ control, including the mixed sensitivity problem, are so arranged that the weights ($W_S$ and $W_T$ in this case) are added to outside the control loop, as shown in FIG. 5, to perform desired frequency shaping. Namely, the main purpose is "frequency shaping for closed-loop characteristics." In contrast, the conventional classical control theory is directed mainly to "frequency shaping for open-loop characteristics" where the loop transfer characteristics are shaped into desired characteristics based on the frequency response of the controlled object. Although the design in the frequency region could be made by the $H_\infty$ control using the mixed sensitivity problem, it was difficult to apply the conventional design technique of a control system based on the classical control theory to the control technique by the $H_\infty$ control as it was.

There was another problem that the control technology of the conventional $H_\infty$ control had difficulties in the adjustment of design parameters, as compared with the control technology based on the classical control theory. In more detail, for example, with a PID compensator of the typical method in the classical control theory, the design can be done by observing the frequency characteristics with three parameters of proportion, integration, and derivative. Further, simple and practical design methods are widely known as to the PID compensator (for example, the limit sensitivity method of Ziegler-Nichols, the Chien-Hrones-Reswick method, the control area method, etc. as described for example in Masubuchi: fundamental theories for automatic control, revised; Corona Co.).

In contrast, for example, the mixed sensitivity problem surely permits the design on the frequency base, but needs to determine the weight functions $W_S$, $W_T$ and needs to set parameters of the respective transfer functions. It is thus clear that the PID compensator is much easier in adjustment and much more abundant in knowhow as to adjustment.

In addition, it can be said that the control technology of the modern control theory up to the 70s represented by the optimal control is, so to speak, a design in a time domain for designing the control system basically with constant matrix weights. It was difficult to quantitatively measure the influence of the setting of design parameter based on the frequency characteristics of the control system. That is, the design in the frequency region, important in securing the robustness, was very difficult. This complexity in design when compared with the classical control was one of the reasons why the control technology of the modern control theory was rarely employed at the level of practical products while the significance in pursuing higher performance was strongly recognized in accordance with control technology based on new control theories, such as modern control theory, including robust control theory.

It is thus the present status in the field that for steppers or robots, the classical control technology represented by the PID compensator, which has well-known parameter adjustment methods and which is fully practical, is still used as the control technology in most control apparatus at present.

Problem 4

In the case of a control system for performing a long-term and continuous operation, for example, such as an XY stepper, degradation due to a characteristic change of the XY stage as the controlled object is an inevitable problem. The position dependence of the dynamic characteristics of the controlled object often becomes another problem, because the movable range of the XY stage is long. As for variations in the low frequency region among the characteristic variations, high-gain characteristics can be achieved in the low frequency region by employing the compensator of the type-one servo system, so that it is rare for the variations in the low frequency region to become a problem for control performance. Variations in the high frequency region are rather likely to become a problem for control performance, whereby the control system would become unstable in the worst case.

The purpose of the robust control technology is to maintain the stability of the system even with such characteristic variations, but there is a dilemma that as the control system is constructed with estimation of a wider range of characteristic variations, the resultant control system becomes a conservative (that is, slow in response) system. To achieve both the proper robustness and high control performance, it is thus desirable that the stabilizing compensator be automatically re-adjusted based on an output signal while a test signal is applied to the system either periodically to prevent performance degradation due to long-term operation or at each of some typical points to prevent performance degradation due to the position dependence of characteristics of the controlled object, so as to change the stabilizing compensator.

This automatic adjustment is relatively easy with the control technology of the conventional classical control represented by the PID compensator, because it involves a smaller number of design parameters and there is abundant accumulated knowhow as to the design. With control technology of the modern control theory including conventional robust control theory, however, the automatic adjustment was very difficult because of the complexity of the design parameters as described in Problem 3. When the automatic adjustment was carried out based on control technology of the conventional classical control represented by the PID compensator, the stability of the control system will never be affected by the automatic adjustment, because the adjustment is based on the frequency response without using a model of the controlled object. In contrast, where the automatic adjustment is carried out based on the conventional modern control theory including robust control theory, there is a possibility that the control system becomes unstable as a result of the automatic adjustment because of modeling errors, etc., caused by complex computations with a model.

Therefore, an adjustment algorithm must be able to construct a control system with complete maintainability and some performance even if it is found that the desired characteristics are not attained after automatic adjustment. When the automatic adjustment is carried out by modern control theory including the conventional robust control theory, construction of such an adjustment algorithm was difficult. This point was also a big problem in practical applications for products.

Problem 5

The problems as described above are related mainly to control technology based on conventional modern classical theory including robust control theory. Let us next consider problems in control technology based on conventional classical control theory represented by the PID control. As described previously, control technology based on the conventional classical control theory has excellent features, for example, no need for a model of the controlled object, ease in adjustment of the design parameters, etc. These merits, however, also become demerits in increasing the accuracy or speed of the control system in order to meet requirements for more complex, more advanced, or finer devices.

For example, with the spread of a control band with the recent tendency toward higher speed and higher accuracy of the control technology, an oscillation mode of the controlled object often becomes a problem, though it has never been. In this case, the general technique is to insert a notch filter into the control system in control technology based on the classical control theory. However, such a notch filter tends to affect the performance of the control system, resulting in degrading, particularly, the transient characteristics of the control system.

It is thus difficult to design a suitable control system, based on control technology of classical control theory, for controlled objects having an oscillation mode thereof, causing a problem for control in the band. In other words, the conventional classical control technology is excellent for controlling problems solvable in the category of the PID compensator because the most significant feature is the ease of design with a small number of design parameters; on the other hand, the superiority is completely lost in the case of complex stabilizing compensators necessitating the notch filter.

On the other hand, it is not too much to say that there is little superiority of the control technology of the conventional modern control theory, including the robust control theory, over the PID compensator if no problematic oscillation mode exists in the control band. However, if there is any oscillation mode to become a problem in the control band, a stabilizing compensator, with optimality compensated for, can be obtained by constructing a model of the controlled object taking the oscillation mode into account. In addition, the notch filter in the meaning in the classical control theory must be automatically incorporated very skillfully into the thus obtained compensator.

Nevertheless, the control technology of the conventional modern control theory, including the robust control theory, had the problems as described previously in Problem 3 and Problem 4, and therefore the design was not easy. Accordingly, considering the control technology for cases where there is any oscillation mode to become a problem within the control band, to be desired is control technology based on robust control theory which is easy in design as with the PID compensator and excellent in maintainability, but such control technology has never been developed.

Problem 6

The order of the compensator in the conventional optimal control is basically equal to that of the controlled object. In the case of the type-one servo system being constructed, construction of the expanded system including the integrator increases the order only by the order of the integrator, one. Namely, the design of the optimal control yields a compensator of a very reasonable order whereby a "desired response characteristics can be achieved for any controlled object, using a compensator of an order equal to that of the controlled object." It can be said to be a kind of compensator of a necessary minimum order.

However, most of the control technique using the conventional $H_\infty$ control, including the mixed sensitivity problem, performs the desired frequency shaping with frequency weights added. Since the order of the compensator in the $H_\infty$ control problem is equal to that of the generalized plant, the order of the compensator is given as follows: (order of compensator)=(order of controlled object)+(order of $W_S$)+(order of $W_T$). Clearly, the conventional $H_\infty$ control technology using the frequency weights provides a redundant compensator. Of course, the order becomes higher for constructing the servo system. Since it is not practical to realize such a compensator by an analog circuit, it is normal in actual applications to realize it by digital control using a CPU. Then, the redundancy in the above-described compensator would become a serious problem if a one-chip CPU were desired to execute computations including all processes, such as the man-machine interface and safety measures, as well as the control, because of the limit in cost.

It is surely expected that use of the $H_\infty$ control will provide control performance of higher robustness than the conventional optimal control represented by the LQG (Linear Quadratic Gaussian) control. This is evident from the fact that the LQG control is a control technique for optimizing a kind of "average value" of input and output characteristics of the generalized plant while the $H_\infty$ control is a control technique for performing optimization under the worst conditions assuming the "worst case" of input and output characteristics of the generalized plant.

However, even if the control system with the compensator calculated by the conventional $H_\infty$ control using the frequency weights is of high performance, there are cases in which it cannot be realized in connection with the processing time. In that case, a compensator by the $H_\infty$ control of a necessary minimum order without redundancy is desired even with sacrificing the ease of design, as in the optimal control. However, no control apparatus with the $H_\infty$ control having such a feature has been developed.

In view of the above problems, an object of the present invention is to provide a high-performance control apparatus based on a new robust control theory. More specifically, the object is to provide a control apparatus having either one of the features listed below.

(1) The apparatus can succeed to the technical storage of control technology based on classical control theory.

(2) Further improvements in control performance can be achieved over control technology based on the classical control theory.

(3) The apparatus involves a small number of design parameters, thus being easy to automatically adjust and excellent in maintainability.

(4) A type-one servo system can be constructed.

(5) Updating of the control system by automatic adjustment can be easily achieved.

(6) There is no redundancy of the compensator similar to the conventional LQG optimal control technology.

To achieve the above object, the control apparatus of the present invention has drive means for driving a body to be controlled, state observing means for observing a moving state of the body to be controlled, desired value producing means for producing a state desired value for the body to be controlled, robust stabilizing compensation means for producing a control signal for the drive means from a state observation signal by the state observing means and the state desired value by the desired value producing means, test signal generating means for generating and applying a test signal to a control system of the body to be controlled by the robust stabilizing compensation means, test output signal detecting means for detecting the test output signal, arithmetic means for calculating a parameter of the robust stabilizing compensation means using the test output signal, and parameter changing means for changing the parameter of the robust stabilizing compensation means, based on the calculation by the arithmetic means.

This enables control always using the optimal compensation means even for controlled objects that have a problem of performance degradation due to long-term operation. Further, the parameter of the stabilizing compensation means can be changed over depending upon the position of the controlled object, taking account of the position dependence of characteristics of the controlled object, whereby stable control performance can be achieved while dissolving the unevenness of control performance depending upon the position.

An aspect of the control apparatus of the present invention is characterized in that a frequency shaping compensator, such as the PID compensator, and/or a robust compensator is provided as a series compensation element of the robust stabilizing compensation means. The ease of adjustment with a small number of parameters can be achieved, which was difficult with control technology based on conventional modern control theory including the robust control theory, by using the series compensator obtained by conventional control technology based on the classical control theory and represented by the PID compensator, as a frequency shaping compensator; further, high-speed and high-accuracy control can be achieved, which was not achieved by the conventional classical control theory, by also using the robust compensator by the robust control theory.

Another aspect of the control apparatus of the present invention is characterized in that the arithmetic means has a model for a controlled object consisting of the body to be controlled, the drive means, and the state observing means; an integrator and a proportional gain are connected in parallel to an observation output terminal of the state-space model for the controlled object; a sum of an output from the integrator and an output from the proportional gain is set to a state observation output of an expanded, generalized plant in the standard $H_\infty$ problem; control outputs of the expanded, generalized plant are set to products of the output from the integrator, an internal state amount of the state-space model for the controlled object, and a control input of the state-space mode by respective, proper, constant weight matrices; an exogenous input of the expanded, generalized plant is set to a sum of products of a first derivative of the internal state amount of the state-space model and an observation output from the state-space model for the controlled object by respective, proper weight functions; the $H_\infty$ norm of from the exogenous input of the expanded, generalized plant is minimized; and a robust stabilizing compensator for stabilizing the expanded, generalized plant to the control outputs of the expanded, generalized plant is calculated, whereby parameter(s) of the compensation means for the controlled object is calculated by the robust compensator, the integrator, and the proportional gain.

DETAILED DESCRIPTION OF THE PREFERRED EMBODIMENTS

Embodiment 1

Before describing the embodiments of the present invention, a theoretical aspect of the invention is first described. The control apparatus of the present embodiment is characterized by use of the $H_\infty$ control technology by normalized coprime factorization. The following describes the $H_\infty$ control technology using the normalized coprime factorization and its operation with a one-input-output system for simplicity.

The normalized coprime factorization is first described. Coprime factorization is a method for expressing a transfer function not in the form of a ratio of polynomials but in the form of a ratio of rational functions that are mutually coprime, stable, and proper. For example, $P(s)=(s-1)/(s+2)$ can be expressed as follows:

$$P(s) = \frac{s-1}{s+2} = M^{-1}N, \quad N = \frac{s-1}{s+1}, \quad M = \frac{s+2}{s+1} \quad (11)$$

In this case, the denominator polynomial of M and N in Equation (11) may be any linear polynomial having a stable root. Then the normalized coprime factorization means satisfying the following normalization.

$$M^2 + N^2 = 1 \quad (12)$$

Next described is the control technology using normalized coprime factorization, which is a kind of $H_\infty$ control. Using the normalized coprime factorization, a controlled object including uncertainty of a model of the controlled object can be expressed as follows with the numerator and denominator each including uncertainty.

$$P_\Delta = (M + \Delta_m)^{-1}(N + \Delta_n) \quad (13)$$

Figure 7:
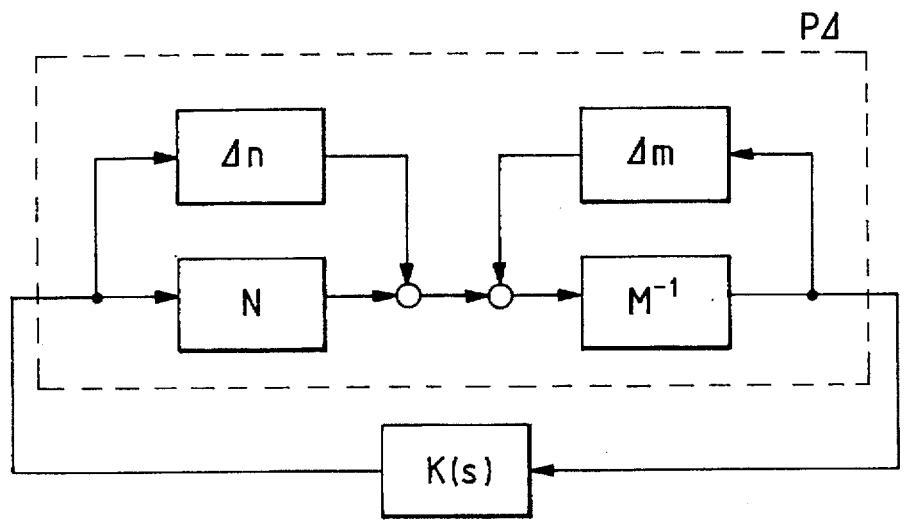
FIG. 7 is a block diagram of a controlled object and uncertainties thereof in a normalized coprime factorization.

This is shown in FIG. 7. In this case, it is known that necessary and sufficient conditions for a compensator K, to stabilize the system for controlled object classes in which the $H_\infty$ norm of variations is given by the following equation:

$$\|[\Delta_m, \Delta_n]\|_\infty \leq \epsilon_{max} \quad (14)$$

are (i) that K stabilizes a nominal controlled object P, and (ii) that the following equation is satisfied.

$$\left\| \begin{bmatrix} K \\ I \end{bmatrix} (I-PK)^{-1}M^{-1} \right\|_\infty \leq \epsilon_{max}^{-1} = \gamma_{min} \quad (15)$$

To obtain a stabilizing compensator satisfying these conditions the $H_\infty$ control system is designed by normalized coprime factorization. Noting the relation of equation (12), Equation (15) can be deformed as follows.

$$\left\| \begin{bmatrix} K \\ I \end{bmatrix} (I-PK)^{-1}M^{-1} \right\|_\infty \quad (16)$$

$$= \left\| \begin{bmatrix} K \\ I \end{bmatrix} (I-PK)^{-1}M^{-1}[M,N] \right\|_\infty$$

$$= \left\| \begin{bmatrix} K \\ I \end{bmatrix} (I-PK)^{-1}[I,P] \right\|_\infty$$

$$\leq \epsilon_{max}^{-1} = \gamma_{min}$$

Figure 8:
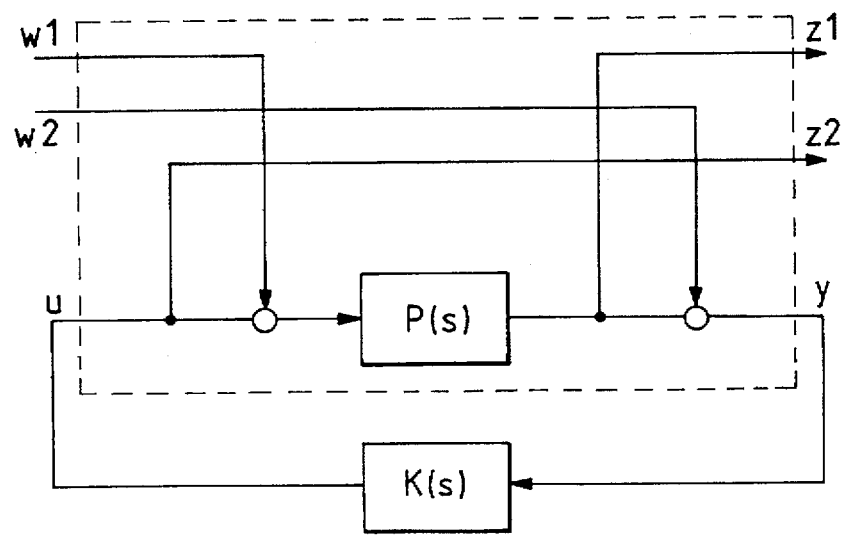
FIG. 8 is a block diagram to show an input-output relation equivalent to the $H_\infty$ control by the normalized coprime factorization.

It is thus understood that the mixed sensitivity problem decreases $W_S S$ and $W_T T$ while the $H_\infty$ control system design process with the normalized coprime factorization decreases the $H_\infty$ norm of a transfer function composed of four transfer functions of S, T, KS, and SP from Equation (16). This can be understood as an optimization problem where an exogenous signal input and a control output signal are also set on the input side as well as on the output side of the controlled object, as shown in FIG. 8. Accordingly, the problem of pole zero cancellation will not occur between the controlled object and the compensator, which occurred in the mixed sensitivity problem.

The $H_\infty$ control system using the normalized coprime factorization can employ a method for deriving the stabilizing compensator satisfying Equation (15), which is based not on the algorithm using the conventional standard $H_\infty$ control problem but on the following algorithm completely different therefrom. The algorithm excludes the constraint of Equation (10). Accordingly, the stabilizing compensator can be derived without any problem even for cases where the compensator and/or the controlled object includes an integrator, which were not able to be realized by the mixed sensitivity problem. This is one of very advantageous operations of the present invention using the $H_\infty$ control technology and the normalized coprime factorization.

Algorithm for deriving stabilizing compensator by normalized coprime factorization Step 1 For minimal realization of P(s), Generalized Control Algebraic Riccati Equation and Generalized Filtering Algebraic Riccati Equation (hereinafter referred to as GCARE and GFARE, respectively) are obtained. Namely, when state equations in minimal realization of P(s) are given by the following equations:

$$\left. \begin{array}{l} x = Ax + Bu \\ y = Cx + Du \end{array} \right\} \quad (17)$$

solutions X and Z of the following equations are GCARE and GFARE, respectively.

$$(A-BS^{-1}D^TC)^TX+X(A-BS^{-1}D^TC)+XBS^{-1}B^TX+C^TR^{-1}C=0 (A-BD^TR^{-1}C)Z+Z(A-BD^TR^{-1}C)^T+ZC^TR^{-1}CZ+BS^{-1}B^T=0 R=I+DD^T, S=I+D^TD \quad (18)$$

Step 2 The upper limit of variations in the normalized coprime factorization of P(s) can be obtained by calculating the following.

$$\epsilon_{max} = (1-\|[N,M]\|_H^2)^{1/2} = \gamma_{min}^{-1} \quad (19)$$

Here, $\|G\|_H$ represents the Hankel norm of G given as follows.

$$\|G\|_H = \max_i (\lambda_i^{1/2}(\Pi\Theta)) \quad (20)$$

In the above equation, $\Pi$ and $\Theta$ represent controllable Gramian and observable Gramian of G, respectively, and $\lambda_i$ represents an eigen value.

Step 3 For simplicity, the state-space representation like Equation (17) will be expressed hereinafter by an abbreviated form of (A:B:C:D). Then the normalized coprime factorization of P(s) is obtained by the following calculation.

$$M = (A + HC : B + HD : R^{-\frac{1}{2}}C : R^{-\frac{1}{2}}D) \quad (21)$$

$$N = (A + HC : H : R^{-\frac{1}{2}}C : R^{-\frac{1}{2}}) \quad (22)$$

Here, H is given by the following equation.

$$H = -(ZC^1 + BD^1)C^{-1} \quad (23)$$

Step 4 The stabilizing compensator $K(s) = (A_K : B_K : C_K : D_K)$ to be obtained can be obtained by the following equations.

$$\begin{aligned}
A_K &= A + BF + \gamma^2 W_1^{-1} ZC^1(C + DF) \\
B_K &= \epsilon^{-2} W_1^T ZC^T \\
C_K &= B^T X, \quad D_K = -D^T \\
F &= -(I + D^T D)^{-1}(D^T C + B^T X) \\
W_1 &= I + (XZ - \epsilon^{-2} I)
\end{aligned} \quad (24)$$

Here, $\epsilon$ is a constant satisfying $\epsilon \ll \epsilon_{max}$.

Figure 5:
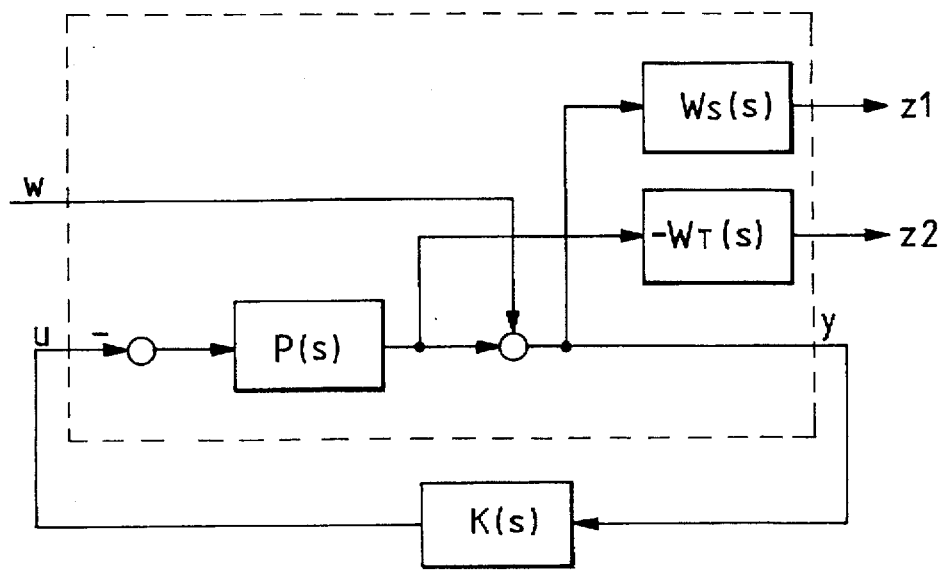
FIG. 5 is a structural drawing of a generalized plant and a stabilizing compensator in the mixed sensitivity problem.
Figure 6A:
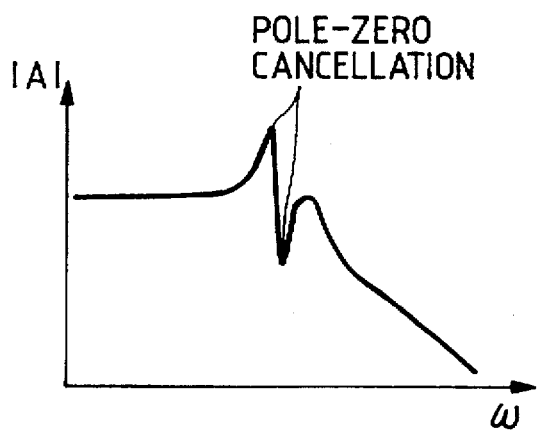
FIGS. 6A to 6D are diagrammatic drawings of the pole-zero cancellation in the mixed sensitivity problem.
Figure 6C:
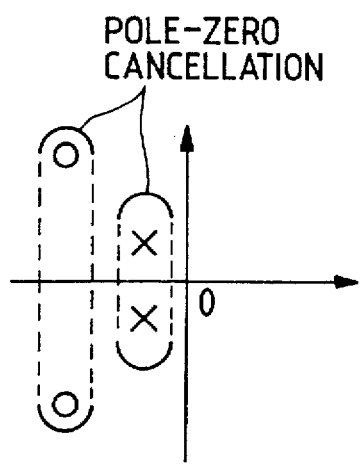
Figure 6B:
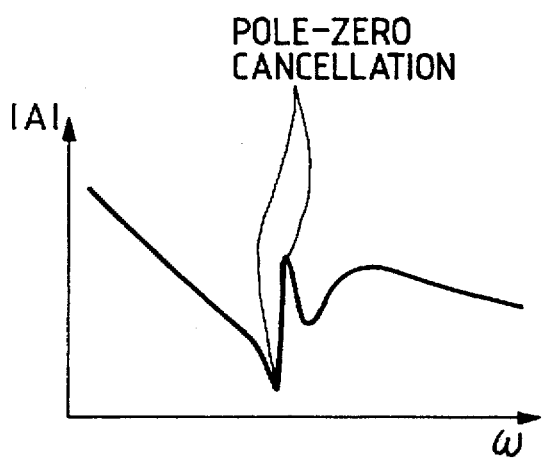
Figure 6D:
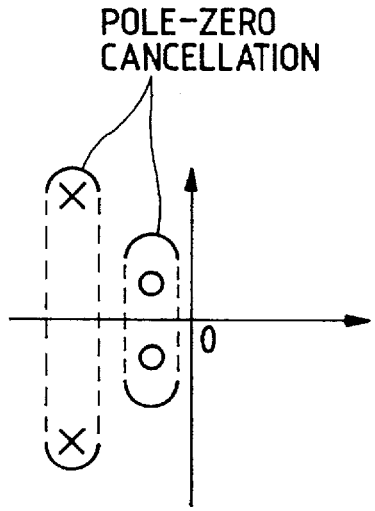

Next described are specific design procedures using the above algorithm. In the case of the mixed sensitivity problem, as shown in FIG. 5, the frequency shaping for closed-loop characteristics is made while the weights, $W_S$, $W_T$ for frequency shaping are set outside the control loop; whereas the $H_\infty$ control technology using the normalized coprime factorization takes such design procedures that shaping for open-loop characteristics is first made while weights for frequency shaping are set within the control loop and that thereafter the stability and robustness of the control loop, and the control performance are increased by a robust compensator. Therefore, the control technology using the normalized coprime factorization can use the series compensator in classical control as represented by the PID compensator as it is, as a weight for the shaping of open-loop characteristics.

Thus, first designed is the series compensator in the classical control as represented by the PID compensator, the design method of which is fully established and which is known. Then, using it as a weight or frequency shaping compensator, the robust compensator is derived according to the $H_\infty$ control design by the normalized coprime factorization. Thus, the stabilizing compensation means is composed of the frequency shaping compensator and the robust compensator, whereby the frequency shaping can be easily effected while succeeding the control technology based on conventional classical control theory and whereby control performance more than that of the conventional classical control can be achieved by the robust compensator based on the normalized coprime factorization. This is a very advantageous operation in the present invention.

Further, design parameters by the design procedures include just one increment of $\epsilon$ in addition to the design parameters in the control technology based on the conventional classical control technology. This ease of design is the technology that was unable to be realized by conventional control technology based on modern control including robust control, and is one of the features of the present invention, which is a very advantageous operation, in performing automatic adjustment by arithmetic means built in the control apparatus.

Also, $\epsilon_{max}$ is the upper limit of permissible variations in the normalized coprime factorization of a controlled object frequency-shaped by W, which is also taken as an index indicating the validity of frequency shaping. It is because with a very small value of $\epsilon_{max}$, the permissible range of variations becomes very narrow, which means that the gain characteristics shaped by the frequency shaping compensator are not compatible with robust stability. If the PID compensator is used as a frequency shaping compensator and if adjustment is made by the conventionally well-known adjusting method, no problem will arise as to the robust stability at least at the point of frequency shaping. Therefore, the insufficiency of robust stability is caused by large modeling errors of the controlled object used for obtaining the robust compensator.

At the point of calculation of $\epsilon_{max}$ according to Equation (18), if it is smaller than a permissible value preliminarily set, the series compensation element in the stabilizing compensation means is composed only of the frequency shaping compensator, i.e., the series compensator in the classical control represented by the PID compensator. This arrangement enables the securing of the maintainability of the control system and the control performance in conventional classical control even at the worst. This maintainability is also one of the features of the present invention, which is a very advantageous operation, in performing automatic adjustment while the control apparatus is provided with the arithmetic means effectively utilizing classical control technology.

Further, when automatic adjustment is performed using the $H_\infty$ control system design algorithm with the normalized coprime factorization, $\epsilon$ can be adjusted in determining $\epsilon$ so as to achieve the desired robust stability while checking the robust stability in an actual control system by supplying a test signal from a signal generating means to the control system and using a test output signal detected by a test output signal detecting means. This can be easily realized by using such a property that the control system becomes high in robust stability, though the degree of frequency shaping becomes lower as $\epsilon$ is set smaller that $\epsilon_{max}$ in setting $\epsilon$.

This produces a control system having sufficient robust stability even in the cases where the model used in design had some errors. In addition, even if a control system satisfying the desired robust stability is not obtained after adjustment, the maintainability of the control system and the control performance in conventional classical control can be secured even in the worst case by constructing the series compensation element in the stabilizing compensator only of the series compensator in classical control represented by the PID compensator. Such "maintainability" is also one of the features of the present invention, which is a very advantageous operation, in performing the automatic adjustment for the $H_\infty$ control with the arithmetic means built in the control apparatus.

In addition, in the cases where the oscillation mode of the controlled object that was not a problem in the conventional cases becomes a problem with expansion of the control band due to an increase of speed of the controlled object, the control performance, more than that in classical control technology, can be achieved without losing the ease of design in conventional, classical control technology, by providing a model for the controlled object with information on the oscillation mode to become a problem. This is also another feature of the present invention, which exhibits a very advantageous operation.

Accordingly, specific automatic adjustment procedures of the $H_\infty$ control system using the normalized coprime factorization are as follows.

Figure 9A:
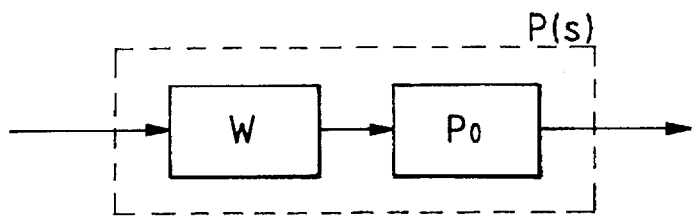
FIGS. 9A to 9C are block diagrams to show design procedures in the normalized coprime factorization.
Figure 9B:
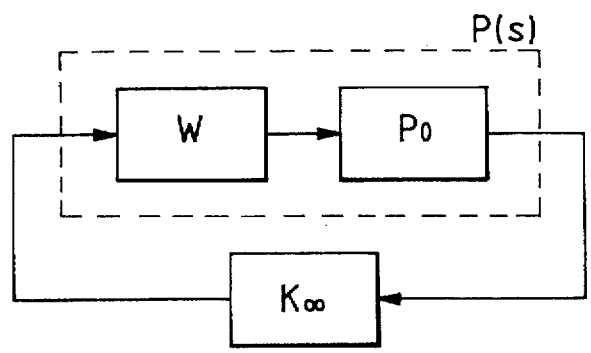

Automatic adjustment procedures of $H_\infty$ control system by normalized coprime factorization (i) As shown in FIG. 9A, the frequency shaping compensator W is set to perform loop shaping so that the controlled object $P = P_0 W$ frequency-shaped with addition of a weight function by the frequency shaping compensator W constructed, for example, of the PID compensator, has desired disturbance removing characteristics and robust stability. This frequency shaping compensator may be one preliminarily calculated, but if it is determined using the control technology based on classical control theory, the automatic adjustment can periodically and easily be carried out using the test signal generating means and test output signal detecting means.

(ii) The normalized coprime factorization is obtained for the frequency-shaped, controlled object P, and $\epsilon_{max}$ for it is calculated from Equation (19). In this case, if $\epsilon_{max}$ is smaller than the permissible value, $K_\infty = 1$ is set. Namely, the series compensation element in the stabilizing compensation means is constructed only of the frequency shaping compensator obtained in (i).

(iii) The design parameter $\epsilon$ ($<\epsilon_{max}$) is designated by on $\epsilon_{max}$, and the robust compensator is obtained for the designated $\epsilon$. The stabilizing compensation means is constructed of the robust compensator and the frequency shaping compensator obtained in (i).

(iv) The robust stability of the control system of the stabilizing compensation means obtained in (iii) is inspected using the test signal generating means and test output signal detecting means. If the desired robust stability is not achieved, returning to (iii), $\epsilon$ is again set and the robust compensator is again calculated. Further, if a control system having the desired robust stability cannot be constructed within the specified range of $\epsilon$, $K_\infty = 1$ is set. Namely, the series compensation element in the stabilizing compensation means is constructed only of the series compensator obtained in (i).

Figure 9C:
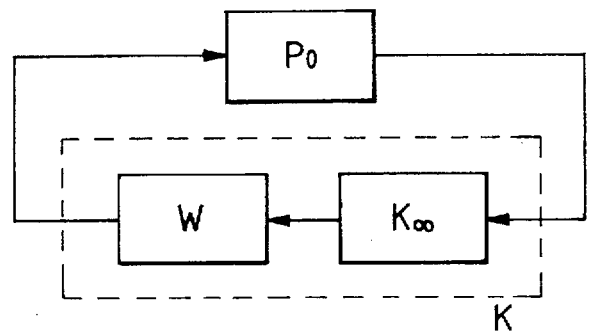

(v) A final compensator K is obtained by $K = K_\infty W$, as shown in FIG. 9C. Here, the $H_\infty$ control technology using the normalized coprime factorization includes the shaping of open-loop characteristics performed so that the $P_W$ has desired characteristics with the weight W in design, but the actual open-loop characteristics are formed by $P_W K_\infty$. In this case, there are cases where the low-frequency characteristics and high-frequency characteristics are somewhat degraded as compared with the desired open-loop characteristics designated by $P_W$. However, it will never result in great degradiation and it is proved that the upper limit and lower limit there are given by the following equations. For all $\omega$ satisfying the following condition:

$$|K_\infty(j\omega)| \geq (\gamma^2 - 1)^{1/2}$$

the following relation holds.

$$|K_\infty(j\omega)| \geq \frac{|P_S(j\omega)| - (\gamma^2 - 1)^{1/2}}{(\gamma^2 - 1)^{1/2}|P_S(j\omega)| + 1} \quad (25)$$

Also, for all $\omega$ satisfying the following condition:

$$|K_\infty(j\omega)| \geq (\gamma^2 - 1)^{-\frac{1}{2}}$$

the following relation holds $$|K_\infty(j\omega)| \leq \frac{(\gamma^2 - 1)^{1/2}|P_S(j\omega)|}{1 - (\gamma^2 - 1)^{1/2}|P_S(j\omega)|} \quad (26)$$

Thus, preliminarily considering such degradation due to $K_\infty$, the degradation of high-frequency characteristics and low-frequency characteristics can be prevented by correcting the high-frequency characteristics and low-frequency characteristics in weight W when the shaping of open-loop characteristics is carried out with the weight W by the conventional classical control technology.

Figure 1:
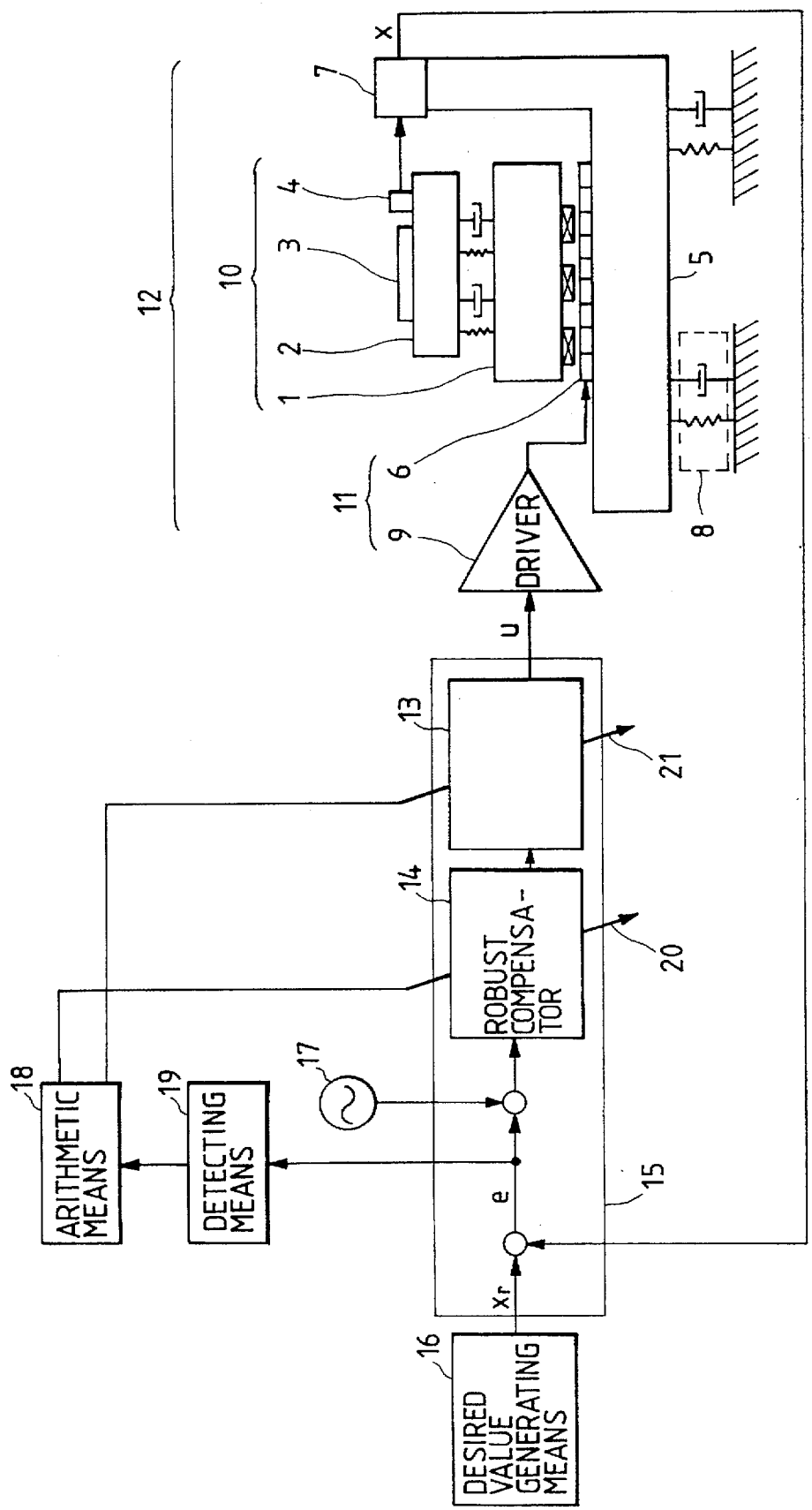
FIG. 1 is a structural drawing of a positioning apparatus for a stepper according to the first embodiment of the present invention.
Figure 2:
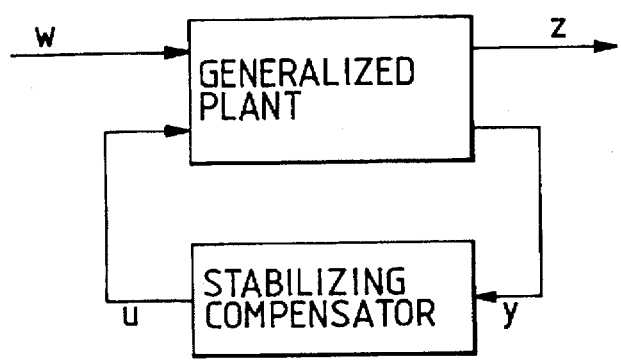
FIG. 2 is a block diagram of a generalized plant and a stabilizing compensator in the standard $H_\infty$ control problem.
Figure 3:
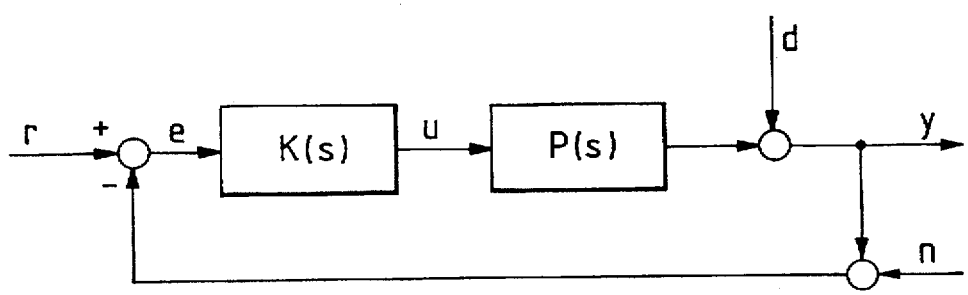
FIG. 3 is a block diagram of a control system with a typical series compensator.
Figure 4:
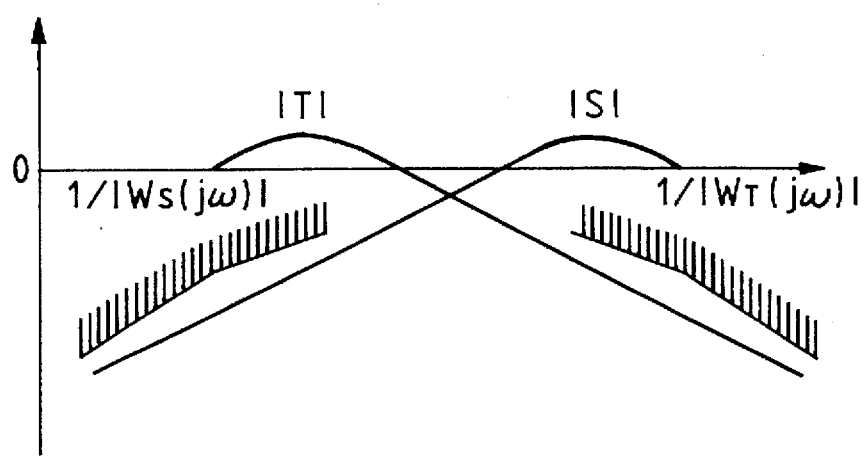
FIG. 4 is a diagrammatic drawing to illustrate the trade-off between the sensitivity function and the complementary sensitivity function.

Next described is a more specific embodiment wherein the above-described theory is applied to a positioning apparatus for a stepper using a linear motor. FIG. 1 shows the structure of the whole of apparatus. In FIG. 1, reference 1 designated an XY stage, 2 denotes a fine movement stage, 3 denotes a wafer, 4 denotes a mirror, 5 denotes a vibration-proof table, 6 denotes a linear motor, 7 denotes a position measuring means utilizing a laser interferometer, 8 denotes a vibration-proof means for the vibration-proof table 5, 9 denotes a drive circuit, 10 denotes a body to be controlled, consisting of the XY stage 1, the fine movement stage 2, the wafer 3, and the mirror 4, 11 denotes a drive means consisting of the linear motor 6 and the drive circuit 9, 12 denotes a controlled object consisting of the body to be controlled 10, the drive means 11, and the position measuring means 7, 13 denotes a frequency shaping compensator based on the classical control such as the PID compensator, 14 denotes a robust compensator using the $K_\infty$ control by the normalized coprime factorization, which is one of the features of the present invention, 15 denotes a stabilizing compensation means by the frequency shaping compensator 13 and robust compensator 14, 16 denotes a desired value producing means for the body to be controlled, 17 denotes a test signal generating means, 18 denotes an arithmetic means for the stabilizing compensation means 15, 19 denotes a test output signal detecting means, and 20 and 21 denote parameter changing means for changing parameters of the stabilizing compensation means 15.

The XY stage 1 is moved in the XY directions by the drive means 11 to be positioned thereby. The fine movement stage 2 is for correcting the inclination and the height of the surface of wafer 3 to be subjected to printing, after completion of positioning by the drive means 11. A displacement x of the body to be controlled 10 is detected by a position of the mirror 4 set on the fine movement stage 2, using the position detecting means 7 by the laser interferometer set on the vibration-proof table 5. Thus, x is the relative displacement between the vibration-proof table 5 and the body to be controlled 10.

The desired value producing means 16 produces a desired value $x_r$ for the above relative displacement, which is sent to the stabilizing compensation means 15. Inside the stabilizing compensation means 15 a deviation e between the desired value $x_r$ and the actual relative displacement x is sent to the robust compensator 14. Then an output from the frequency shaping compensator 13 is sent to the drive means 11 where the output is subjected to current amplification. Thus, an amplified signal is sent to the linear motor 6. At the initial setting and periodically after that, the test signal generating means 17 generates a test signal to apply it to the control system of the stepper. A test output signal for the test signal is detected by the test output signal detecting means 19 to be sent to the arithmetic means 18. The arithmetic means 18 calculates the parameters of the stabilizing compensation means 15, based on the information, and automatically changes the parameters of the stabilizing compensation means 15 with the parameter changing means 20 and 21.

In order to cope with the position dependence of characteristics of the controlled object, a plurality of parameters are prepared for the stabilizing compensation means 15 and are changed over depending upon the displacement x. The above automatic adjustment procedures are used for this operation. Then the functions of the arithmetic means 18 are next described. As described above, the arithmetic means 18 calculates the parameters of the stabilizing compensation means 15, based on the $H_\infty$ control technology by the normalized coprime factorization, and the present embodiment uses the PID compensator as the frequency shaping compensator 13. The frequency shaping compensator 13 by this PID compensator is determined as follows by the automatic adjustment.

A test signal is generated by the test signal generating means 17 to be added to the control system constructed of the PID compensator having been used up to that point (which is a provisional PID compensator functioning only to secure the stability in the initial state) (where the robust stabilizing compensator $K_\infty$ at this moment is thus set to 1), and then a test output signal for the test signal is detected by the test output signal detecting means 19. Based on the input-output relation, the arithmetic means 18 calculates a new parameter for the frequency shaping compensator 13 with the PID compensation, and the parameter changing means 21 updates the frequency shaping compensation 13.

Figure 10A:
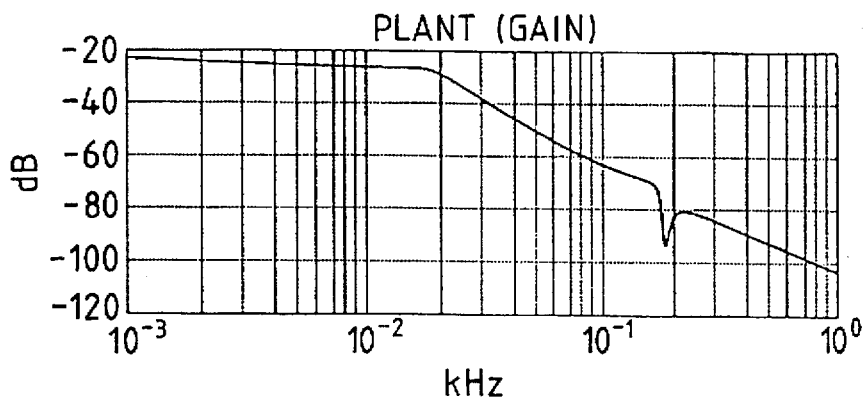
FIGS. 10A and 10B show the frequency response of a design mode of a controlled object.
Figure 10B:
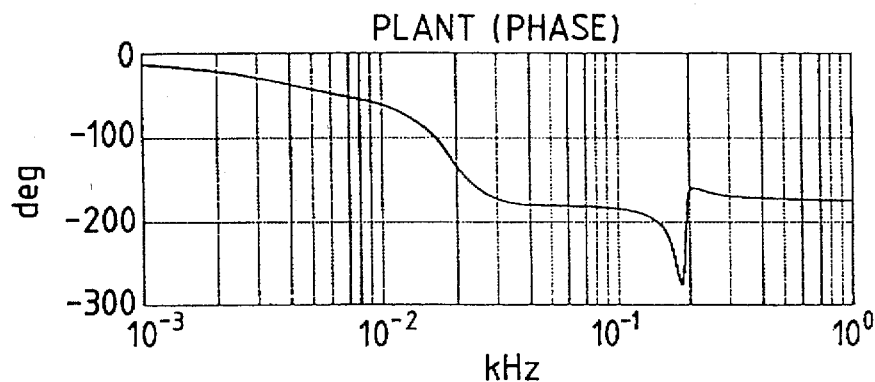

Since the robust stabilizing compensator is thus calculated after calculating the frequency shaping compensator 13, succeeding the conventional classical control technology, the arithmetic means 18 needs to be provided with a model of the controlled object 12 for that purpose. FIGS. 10A and 10B show the frequency response of the mode of the controlled object 12 set in the arithmetic means 18, and the model is a kind of low-order design model in which only the first-order oscillation mode of fine movement stage 2, which will be a problem on positioning control, is taken into account in order to design the stabilizing compensator of a necessary minimum order. In FIGS. 10A and 10B, the oscillation mode at about 16 Hz is the effect of the XY stage 1, and the oscillation mode at about 150 Hz is the effect by the fine movement stage 2 that will be a problem on the positioning control.

In the positioning control of the stepper in the XY directions, the fine movement stage 2 can be deemed as a kind of oscillation load. This oscillation of the fine movement stage becomes a bottleneck, which was a hindrance in achieving sufficient positioning performance in control technology based on classical control, such as the PID compensator.

Figure 11:
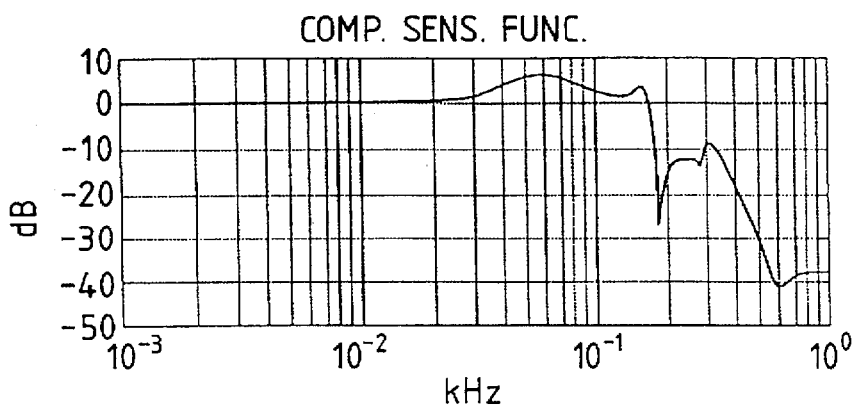
FIG. 11 shows the numerical analysis of frequency characteristics of the desired value response of a control system by the PID compensator.
Figure 12:
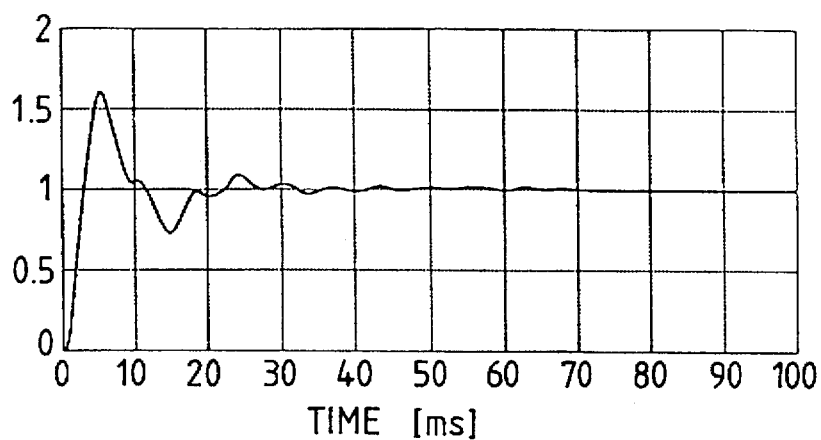
FIG. 12 shows a numerical analysis of a unit step response of the control system by the PID compensator.

FIG. 11 and FIG. 12 show the frequency characteristics of a desired value response and a state of unit step response where the stabilizing compensation means 15 is constructed using only the frequency shaping compensator 13 according to the PID compensation, as obtained by the above-described automatic adjustment. This is nothing but the characteristics of the conventional control technology using the PID compensator. However, FIG. 11 and FIG. 12 are calculation results using a higher-order simulation model for the controlled object 10 as constructed taking higher-order modes of the fine movement stage into account in order to accurately calculate the behavior of actual control systems.

In FIG. 12, it is seen that the vibration of the fine movement stage 2 at about 150 Hz degrades the positioning characteristics. Clearly, an increase of speed by a band shift of the servo system to the higher band is reciprocal to stabilization of the servo system against higher-order resonance of the fine movement stage, and, therefore, the conventional control technology failed to fully increase the speed. The effect of fine movement of the fine movement stage 2 appears outstanding as a peak at about 150 Hz in the frequency response of FIG. 11.

Such an oscillation mode, to become a problem on the positioning control, should be able to be controlled even by the conventional modern control theory, for example, by the $H_\infty$ control using the optimal control or the mixed sensitivity problem. Its adjustment however, was more complex as compared with the control technology based on classical control such as the PID compensator, and had problems as product technology. Thus, the arithmetic means 18 first obtains the easily adjustable PID compensator succeeding conventional classical control technology and thereafter, using it as the frequency shaping compensator 13, the robust compensator 14 is obtained while applying the $H_\infty$ control system design, with the normalized coprime factorization, to the frequency-shaped, controlled object.

Now, let us obtain the stabilizing compensation means 15 in a specific manner according to <automatic adjustment procedures of $H_\infty$ control system with normalized coprime factorization> as described previously. As described in the item (ii), $\epsilon_{max}$ is obtained based on $P_0W$. If $\epsilon_{max}$ is smaller than the permissible value preliminarily set, the stabilizing compensation means is constructed only of the series compensator 13 based on the PID compensator, but because $\epsilon_{max}=0.52$ in the present embodiment, which means that the robust compensator 14 with high robustness can be obtained by the $H_\infty$ control based on the normalized coprime factorization, a specific $\epsilon$ smaller than $\epsilon_{max}$ is determined while the arithmetic means 18 calculates the response characteristics of the actual control system using the test signal generating means 17 and output signal detecting means 19, according to items (iii) and (iv), thus obtaining the robust compensator.

Figure 13:
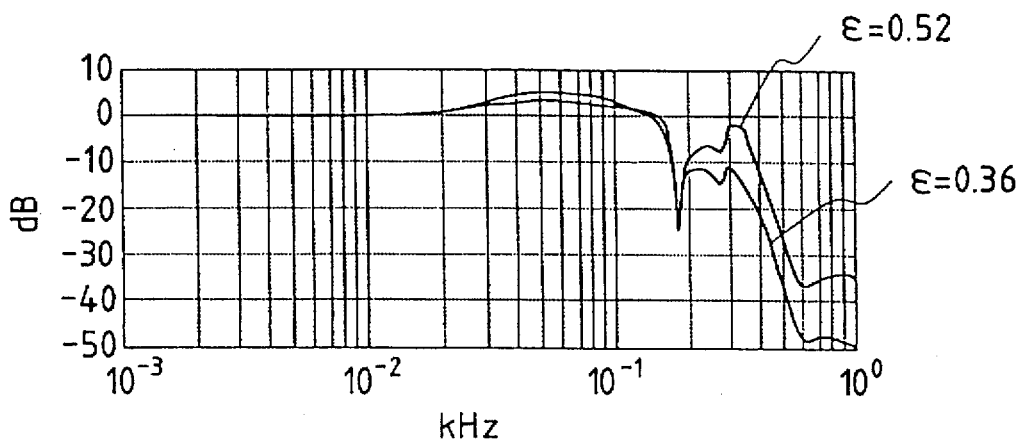
FIG. 13 shows a numerical analysis indicating frequency characteristics of a desired value response with differences in $\epsilon$.
Figure 14A:
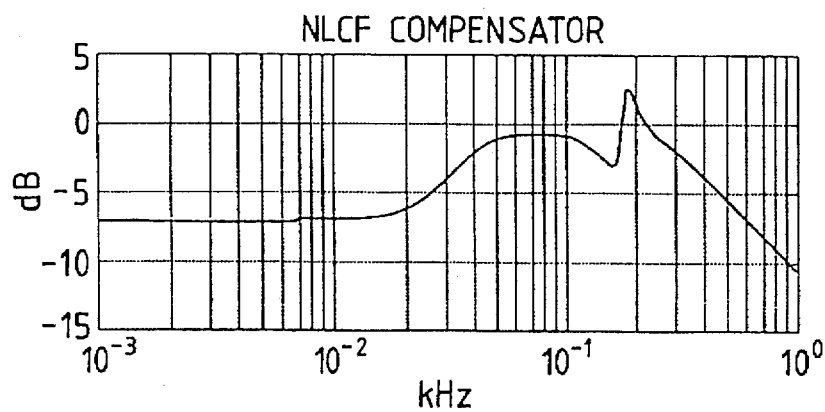
FIGS. 14A and 14B show the frequency response of a robust compensator in the $H_\infty$ control by the normalized coprime factorization.
Figure 14B:
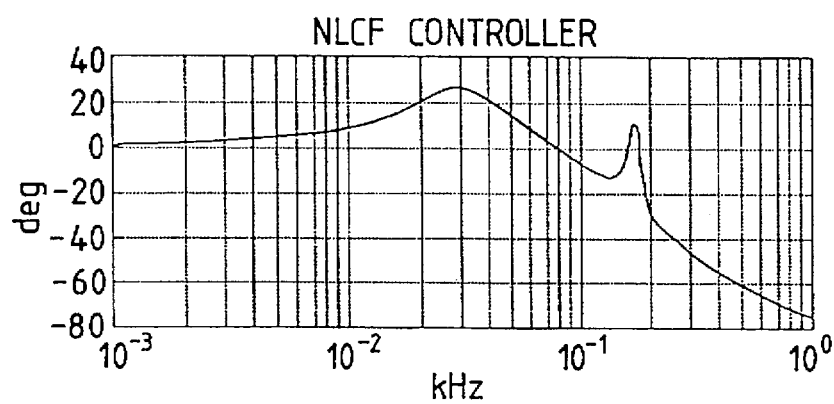
Figure 15A:
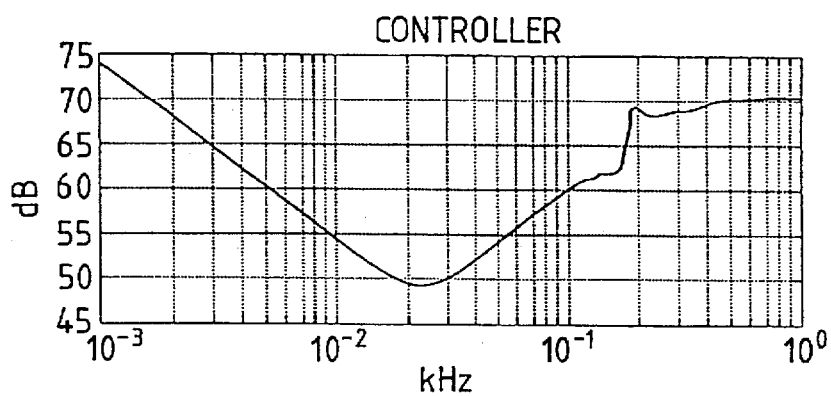
FIGS. 15A and 15B show the frequency response of a stabilizing compensation means of the $H_\infty$ control by the normalized coprime factorization.
Figure 15B:
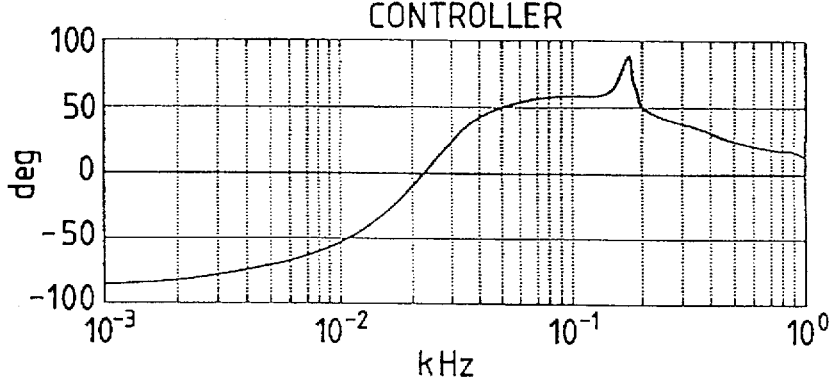

FIG. 13 shows the frequency response of desired value response characteristics with differences of $\epsilon$, using simulation models. As $\epsilon$ approaches $\epsilon_{max}$, the degree of frequency shaping becomes higher. However, because the model used for design is a low-order model taking only the first-order oscillation mode of the fine movement stage 2 into account in order to keep the order of the compensator low, robust stability would be insufficient for the control system by the compensator actually obtained using the model. Since errors with modeling are always present in practice as well as in the present embodiment, it is important in setting $\epsilon$ for the control system to be set to have sufficient robustness.

FIG. 13 clearly shows this state, wherein the robust stability is evidently insufficient at $\epsilon=0.52$. Therefore, $\epsilon$ was determined to obtain sufficient robust stability while checking actual desired value response characteristics using the test signal. After some trials, $\epsilon$ wa determined as $\epsilon=0.36$. As described in the item (iv) in <automatic adjustment procedures of $H_\infty$ control system by normalized coprime factorization>, the stabilizing compensation means 15 may be constructed using only the PID compensator where no compensator calculated for $\epsilon$ in the predetermined range has satisfactory robust stability of the control system.

FIGS. 15A, 15B and FIGS. 14A, 14B show frequency responses of the robust compensator 14 and the stabilizing compensation means obtained with $\epsilon=0.36$ finally set. Here, because the stabilizing compensation means 15 is constructed of the robust compensator 14 and PID compensator 13 in FIGS. 14A and 14B, the features of the control technology according to the present invention should become clear by checking the characteristics of FIGS. 14A and 14B, when compared with the control technology using the conventional PID compensator. Namely, from FIGS. 14A and 14B, it is seen that phase compensation is incorporated near the zero crossover frequency to improve robustness and that the notch filter for controlling the first-order oscillation mode of the fine movement stage 2 is incorporated.

Figure 16:
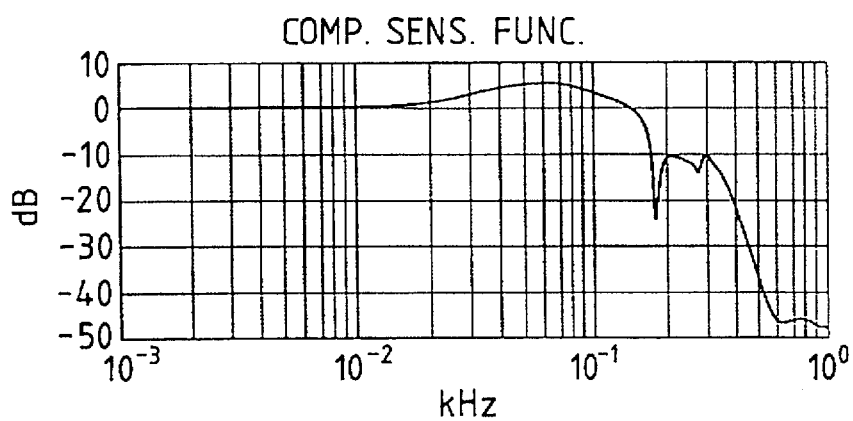
FIG. 16 shows the numerical analysis of frequency characteristics of a desired value response of the $H_\infty$ control system by the normalized coprime factorization.
Figure 17:
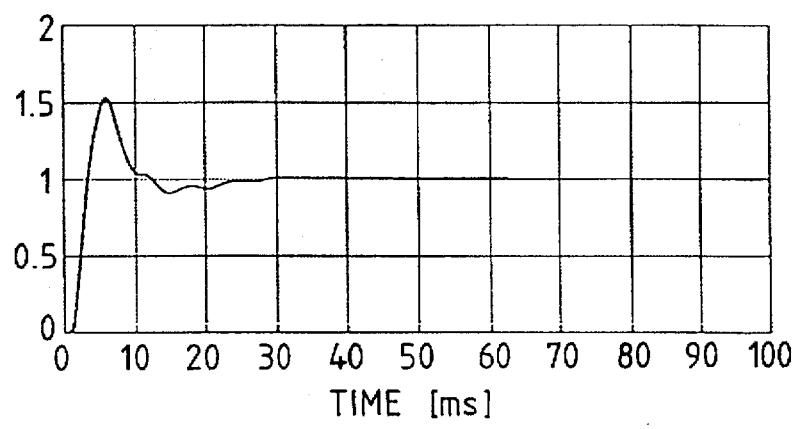
FIG. 17 shows the numerical analysis of a unit step response of the $H_\infty$ control system by the normalized coprime factorization.

Characteristics of the control system using the stabilizing compensation means 15 were also calculated using another simulation model also considering the resonance of higher-order modes of the fine movement stage 2 as described previously. FIG. 16 shows frequency characteristics of desired value response and FIG. 17 shows the unit step response. Comparing this with control technology using the conventional PID compensator as shown in FIG. 11 and FIG. 12, it is seen that the oscillation of the fine movement stage at about 150 Hz is suppressed and the overshooting of the step waveform is also improved.

Figure 18:
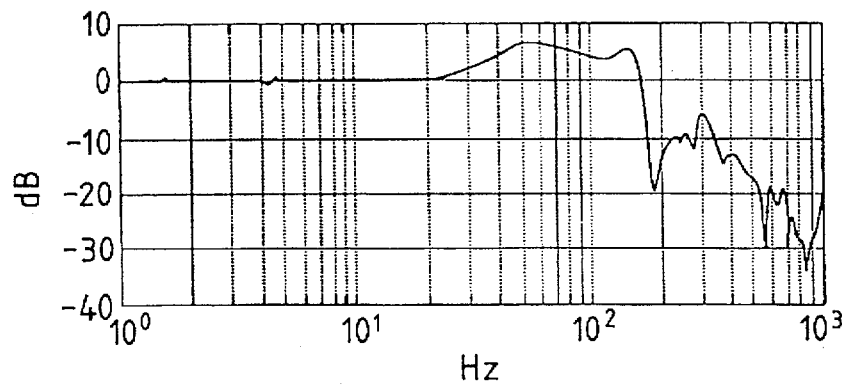
FIG. 18 shows the measurement results of the frequency characteristics of a desired value response of the control system by the PID compensator.
Figure 19:
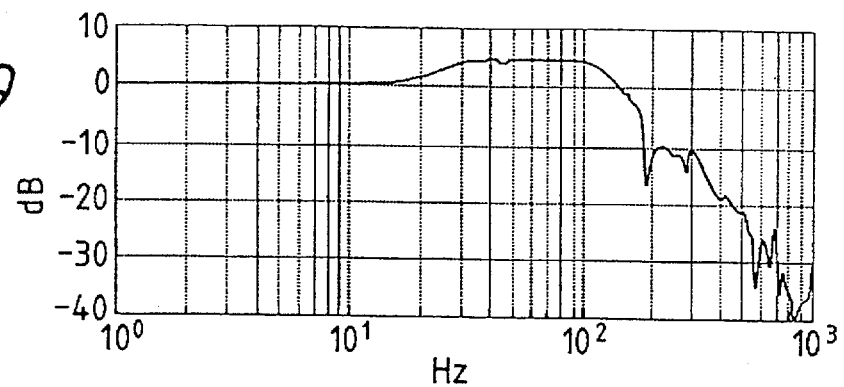
FIG. 19 shows the measurement results of the frequency characteristics of a desired value response of the $H_\infty$ control system by the normalized coprime factorization.
Figure 20:
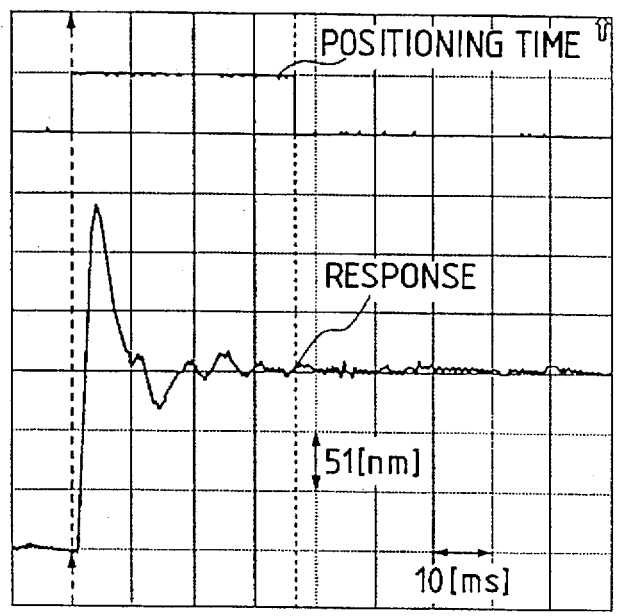
FIG. 20 shows the measurement results of the unit step response of the control system by the PID compensator.
Figure 21:
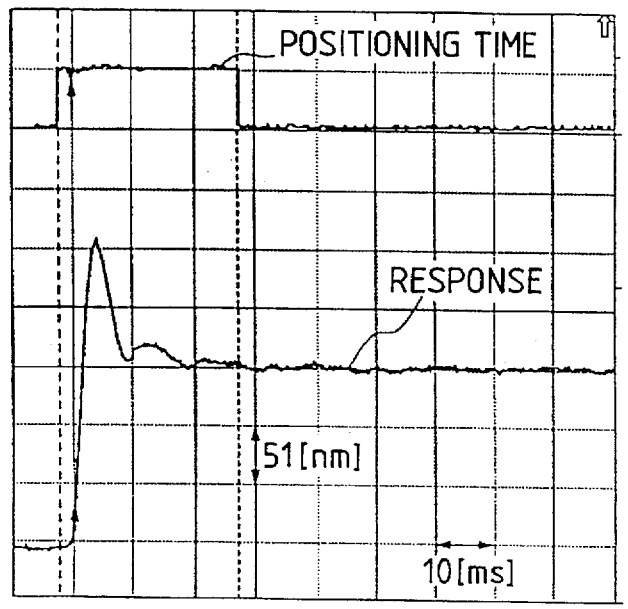
FIG. 21 shows the measurement results of the unit step response of the $H_\infty$ control system by the normalized coprime factorization.

Next shown are results of an actual experiment using the stepper in comparison with the results using only the conventional PID compensator, i.e., the frequency shaping compensator 13. FIG. 18 shows the frequency response to a desired value response in the control technology using the conventional PID compensator, whereas FIG. 19 shows the frequency response to a desired value response in the stabilizing compensation means according to the present embodiment. To compare response waveforms in performing the unit step response and positioning times at that moment, FIG. 20 shows experimental results of control technology using the conventional PID compensator, whereas FIG. 21 shows experimental results of the control technology of the present embodiment. Substantially the same results were obtained as in the numerical analysis previously described, and the actual settling time became about 20% shorter. As shown, the effects of the present invention are clear also in the actual experimental results.

As compared with the frequency-shaped controlled object $P_0W$, the robust compensator 14(=$K_\infty$) using the normalized coprime factorization gives some degradation in the high-frequency region and in the low-frequency region. Nevertheless, it is proved that the upper limit and lower limited are given by Equations (25) and (26) and the degradation is not so great. In the present embodiment, the degradation of about 7 dB occurs in the low frequency region as is apparent from the frequency characteristics of robust compensator 14 in FIGS. 14A and 14B. Thus, the problem of degradation by the robust compensator 14 can be solved by preliminarily considering the degradation and improving the algorithm to set the parameters so that the degradation is compensated for in the automatic adjustment of parameters of the PID compensator.

Embodiment 2

Figure 22:
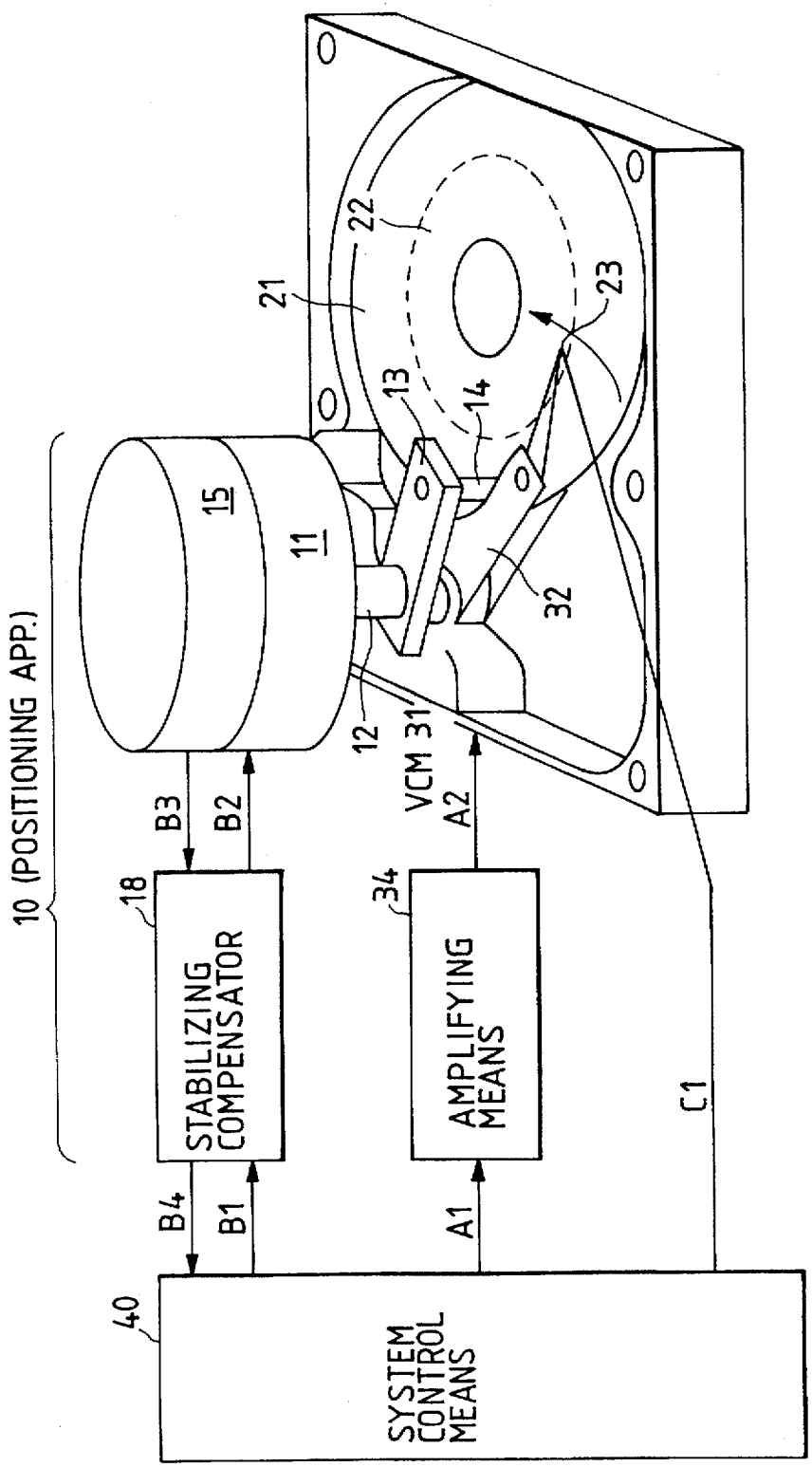
FIG. 22 is a structural drawing of a positioning apparatus for a servo writer according to the second embodiment of the present invention.

FIG. 22 is a structural drawing of a servo writer for a hard disk as a second embodiment of the present invention. In the hard disk, position information needs to be concentrically written for positioning of the head on the disk surface. The so-called servo writer is used to write the position information. The conventional arrangement for writing the position information into the disk surface as described above was such that a reflector, such as a corner cube, was set on a head arm provided in the disk apparatus, a laser beam was projected toward the reflector to measure a position thereof, the head arm was positioned according to the position information, and the position information was written into the disk surface with the head fixed at the distal end of the head arm.

However, as the size of head arm and the size of voice coil motor (hereinafter referred to as VCM) for driving it become smaller with recent miniaturization of the disk apparatus, the method for mounting the reflector becomes incapable of supporting the positioning. Therefore, another method was developed and practically used in such an arrangement that positioning of the head (head arm) is carried out using the servo writer as shown in FIG. 22 and then servo information is recorded. This type of servo writer is so arranged that a positioning device is detachably provided separately from the disk apparatus and the head arm of the disk apparatus is brought into the contact with a positioning member of the positioning device, thereby indirectly positioning the head arm.

The method for writing the servo information is described referring to FIG. 22. First, a system control means 40 supplies a bias signal value for generating a predetermined torque, as a desired bias command signal A 1, to an amplifying means 34. The amplifying means 34 applies a voltage corresponding to the bias command, as a VCM drive signal A2, to VCM 31. A rotational shaft 12 of motor 11 on the side of the position device 10 is arranged to perform positioning of head arm 32 through a drive plate 13 and a pin 14. Thus, controlling the position of the motor rotational shaft 12, the position of head arm 32 is controlled to a designated position of a disk 21. The position of motor rotational shaft 12 is measured by a rotation position detector 15 and an information signal representing the thus measured rotation position (hereinafter referred to as a rotation position signal) B3 is fed back to a motor stabilizing compensation means 18. A rotational angle of the motor is controlled to a desired rotation position by controlling a drive signal B2, based on a deviation between the rotation position signal B3 and a desired rotation position command signal B1.

When the head is stabilized at the desired position, a positioning end signal B4 is sent to the system control means 40. The system control means 40 then sends the desired rotation command signal B1 to the positioning device 10 to control the writing head 23 to a designated position on the disk 21. When the control means 40 receives the positioning and signal B4, that is, when the head is stabilizing at the desired position of a desired servo track 22, the control means applies a writing signal C1 to the writing head 21 to write servo track information on the disk 21. Repeating this process, servo track signals are produced in a desired track density on the disk 21.

With such a servo writer, the control is required to be performed at a higher accuracy for increasing the density of information on the disk and at a higher speed for improving productivity. In this case, oscillation modes of the head and head arm to be positioned are within the servo bandwidth, so that the conventional classical control technology had a limit in increasing the speed as in the case of steppers. Also, the complexity of parameter adjustment was also a big problem in the control technology based on the conventional modern control theory. Further, to realize the automatic adjusting function is desirable in order to provide a control apparatus having high control performance even with differences in dynamic characteristics due to device differences of hard disks, and proper robustness, but the control technology based on conventional modern control theory had problems of complexity of parameter adjustment and insufficient maintainability of the system.

Although the details are omitted because they are the same as in the first embodiment, the control means is so arranged that the design model for the $H_\infty$ control using the normalized coprime factorization is employed as a design model for the servo writer, that the system control means 40 is provided with a calculating means for calculating parameters of the stabilizing compensation means with the design model, changing means for changing the parameters of the stabilizing compensation means, test signal generating means for automatic adjustment, and test output signal detecting means, and that automatic adjustment of the stabilizing compensation means is performed at the initial setting and with necessity thereafter by the method as detailed in the first embodiment, whereby positioning can be effected at a high speed and with high accuracy unable to be reached by conventional control technology.

Embodiment 3

Another embodiment of the present invention is next described. Int he beginning of the description, the theoretical aspect thereof is first described. The present embodiment employs the $H_\infty$ control based on a so-called time response, as control technology for avoiding the problem of pole-zero cancellation and the problem in servo system construction, which were the problems in the conventional $H_\infty$ control technology, and for achieving the stabilizing compensation means of a necessary minimum order without redundancy. To explain the $H_\infty$ control based on the time response, first described is a means for solving the problem of the failure of servo system construction by the conventional technology. A reason why the control technology with the mixed sensitivity problem failed to construct the servo system is that the solvable condition of Equation (10) in the standard $H_\infty$ control problem is not satisfied as described previously. Further expanding Equation (10), it is derived that the condition is equivalent to the following condition.

"$W_T(s)P(s)$ has no zero on the imaginary axis and $P(s)$ has no pole on the imaginary axis (where $W_T(s)$ is a polynomial matrix selected so that $W_T(S)P(S)$ becomes proper)".

This condition is not satisfied where the expanded system is constructed by adding an integrator to $P(s)$ or where an integrator is present in $P(s)$. From the below physical consideration, the above condition is equivalent in fact to "a condition for an optimum compensator $K(s)$ to exist in rational function matrices being stable and proper". Namely, in the case of the mixed sensitivity problem, the exogenous input w is added only to the output side of the controlled object and the control output z is evaluated only on the output side, as described previously. Thus, in the mixed sensitivity problem, the pole-zero cancellation is effected, as also described previously, between stable pole or zero of the controlled object and zero or pole of compensator (the cancellation is not effected for an unstable pole or servo in order to avoid destruction of internal stability, but a pole or zero is produced at a position in a mirror image relation with respect to the imaginary axis). Then desired loop shaping is effected by degrees of freedom of weights $W_S(s)$, $W_T(s)$.

If an integrator is present in $P(s)$, the compensator according to the procedures in the above mixed sensitivity problem will locate a zero at the origin. However, such a compensator is rather not a stable rational function. The constraint condition of Equation (10) is a restriction naturally necessary for excluding such compensators being neither stable nor proper. Therefore, that "a solution is not obtained in the conventional mixed sensitivity problem where a pole of $P(s)$ is on the imaginary axis" is in fact "a necessary condition for an optimum compensator not to exist in stable rational functions in the mixed sensitivity problem". In order to design a servo system while avoiding this problem, it is necessary to "excite a mode on the imaginary axis, of the controlled object by the exogenous signal w, to evaluate a response of this mode, and to construct a generalized plant so as not to effect the pole-zero cancellation on the imaginary axis". To construct an expanded system by adding an integrator to $P(s)$, the system may be arranged so that an exogenous input is supplied to the integrator to excite the mode of the integrator and at the same time so that a robust stabilizing compensator is obtained using an expanded, generalized plant for the servo system, with an output from the integrator as a control output.

Next described is a means for solving the problem of the pole-zero cancellation between the controlled object and the compensator, caused in the mixed sensitivity problem as being the conventional technology. The cause of the pole-zero cancellation in the mixed sensitivity problem is as described in the above problem of the servo system. Accordingly, a means for preventing it cannot be realized by control technology based on the conventional mixed sensitivity problem, but the goal is to "construct a generalized plant so that an exogenous input is added also to the input side of the controlled object, all modes of the controlled object are excited, all state quantities are output as control outputs, all modes of the controlled object are then evaluated, and the pole-zero cancellation is prevented from occurring between the controlled object and the compensator". The generalized plant as constructed based on such an idea is shown in FIG. 24.

Using the means for solving the two problems as described above, the present invention can achieve a stabilizing compensation means of a necessary minimum order without redundancy, overcoming the problem of pole-zero cancellation and the problem of servo system construction. Such control technology is in fact a kind of "$H_\infty$ control considering the time response characteristics". Then, next described are the operation of the present embodiment and the reason why the present embodiment should be called $H_\infty$ control taking the time response characteristics into consideration.

Figure 24:
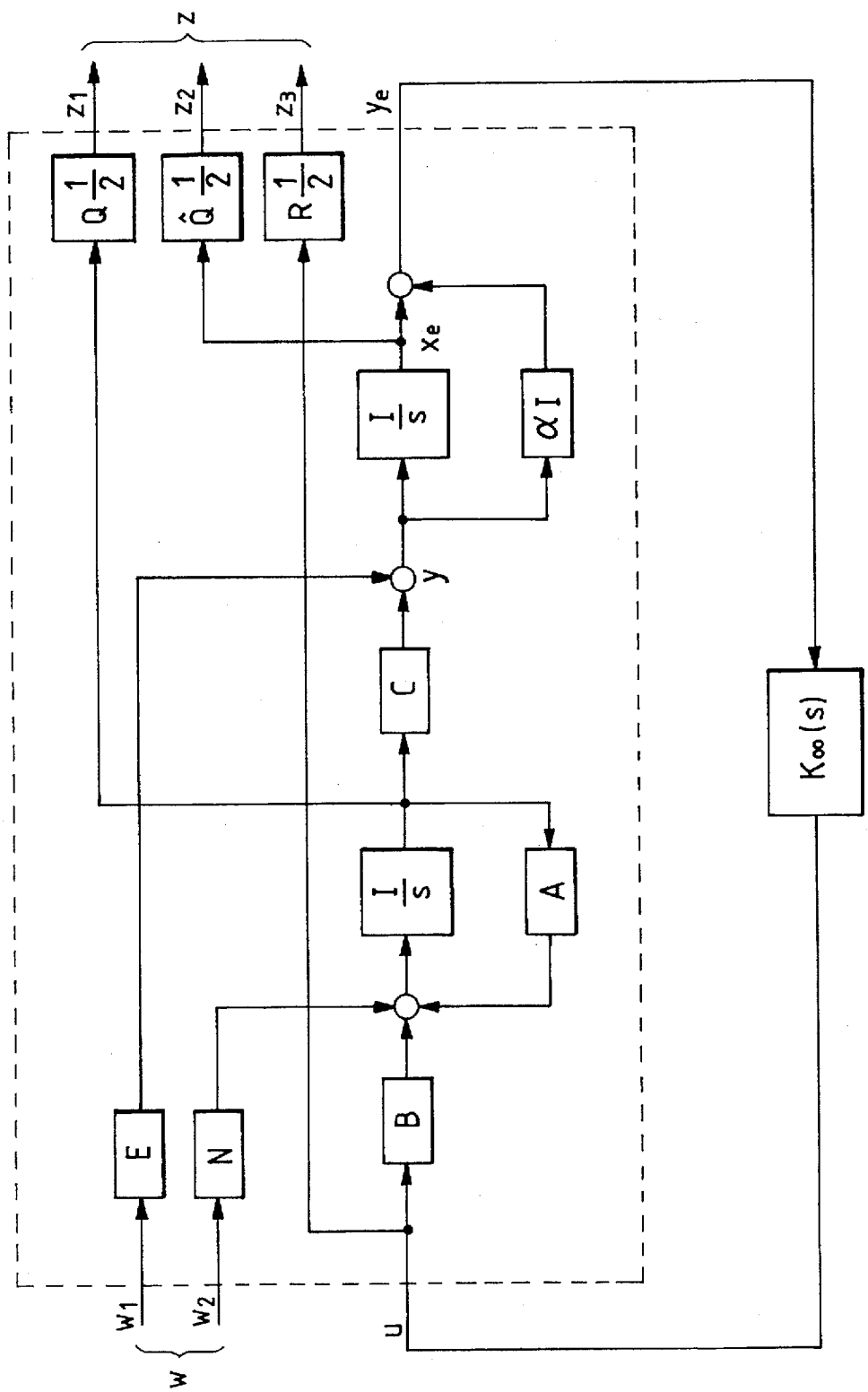
FIG. 24 is a block diagram to show a generalized plant of the $H_\infty$ control taking time response characteristics into account.

Observing FIG. 24 as described above, it is seen that a so-called, expanded, generalized plant is constructed of an element $(\alpha s+1)/s$ with an integrator and a proportional gain $\alpha$ for forming a servo system in addition to the model of the controlled object given by the following state equations.

$$\left.\begin{array}{l} x = Ax + Bu \\ y = Cx + Du \end{array}\right\} \quad (27)$$

A product of the exogenous input $w_1$ by a constant weight E is added to an output from the controlled object, whereby modes of the integrator are excited. Further, a product is taken between the internal state of the integrator and a constant weight $\hat{Q}^{1/2}$, and is set as a control output $z_2$. Thus, the stabilizing compensator $K_\infty(s)$ is obtained from this generalized plant, so that the stabilizing compensation means is constructed by $K_\infty(s)(\alpha s+1)/s$, thereby enabling the realization of one servo system, which was unable to be achieved by the conventional technology based on the conventional mixed sensitivity problem.

Further, an exogenous input $w_2$ weighted by a constant weight N, for exciting all modes of the controlled object, is added to the input side of the controlled object, and the all-state modes of the controlled object are weighted by a constant weight $Q^{1/2}$ to form a control output $z_1$. This arrangement can overcome the pole-zero cancellation between the controlled object and the compensator, which was a problem in the conventional mixed sensitivity problem. Further, in order to set a restriction on high-frequency characteristics of the control input, a control output $z_3$ obtained by weighting a control input by a constant weight $R^{1/2}$ is set as one of the control outputs.

Therefore, these constant weights are design parameters, among which the weight $R^{1/2}$ plays an important role in automatic adjustment because the automatic adjustment function is one of the great features of the present invention. Namely, the weight $R^{1/2}$ has a property to adjust the robust stability of the control system. As $R^{1/2}$ is set larger, the control system can be constructed with higher robust stability, but at the same time the quick-response property of the system decreases. Thus, using this property, an appropriate trade-off is performed between the robust stability and the quick-response property by the automatic adjustment while checking the characteristics of the actual control system.

Specifically, a test output signal from the test signal generating means is added to the control system and, using the test output signal obtained by the test output signal detecting means, the arithmetic means performs repetitive computations of adjusting $r^{1/2}$ before desired robust stability is obtained. Then, the arithmetic means sends final parameters of the stabilizing compensation means to the parameter changing means to update the stabilizing compensation means. By this operation, a robust-stable control system can be constructed even with some errors in the design model for the controlled object. Performing this automatic adjustment not only at the initial setting but also with necessity and at each of plural places, changes with time or position dependence of the controlled-object characteristics can be fully dealt with.

Next described is the order of the stabilizing compensator obtained by the above means. Generally, the order of the stabilizing compensator $K_\infty(S)$ obtained by solving the standard $H_\infty$ control problem is equal to the order of the generalized plant. In the present invention, where the expanded, generalized plant for construction of the servo system is constructed, the order of $K_\infty(S)$ is (the order of controlled object)+1. Since the final stabilizing compensation means is given by $K_\infty(S)(\alpha s+1)/s$, the final order is (the order of controlled object)+2. Actually, the denominator of $K_\infty(S)$ has $(\alpha s+1)/s$, which cancels the numerator of $(\alpha s+1)/s$. Therefore, the order becomes (the order of controlled object)+1, which is one smaller than the above order.

Since the pole-zero cancellation between the controlled object and the compensator is not preferable, the present invention employs the means for preventing it as described previously. Here, the function of the pole-zero cancellation is effectively utilized in order to eliminate the redundancy of the stabilizing compensation means to the contrary. If the servo system is not necessary, the order of the stabilizing compensation means is equal to the order of the controlled object. Namely, the order is a necessary minimum. In contrast, the order of the stabilizing compensation means by the conventional mixed sensitivity problem is (the order of controlled object)+(the order of weight function $W_S$)+(the order of weight function $W_T$), thus being very redundant. In addition, the construction of the servo system is impossible. This non-redundancy of the compensator is one of the operations of the present invention, which constructs the generalized plant using the constant weights.

As the control band is expanded with an increase of speed of the controlled object, an oscillation mode of the controlled object that was never a problem frequently becomes a problem. In such cases, the control performance higher than that by the conventional, classical control technology can also be achieved by providing the model for the controlled object with information on the oscillation mode to be a problem on control performance. This is also one of the operations of the present invention. Now, based on the following definition of the time region, of the $H_\infty$ norm:

$$\|\Phi\|_\infty = \sup_{w \in L_2} \frac{\|\Phi w\|_2}{\|w\|_2} = \sup_{w \in L_2} \frac{\|z\|_2}{\|w\|_2} \tag{28}$$

the $H_\infty$ control of FIG. 24 is equivalent to a problem, for an expanded system given by the following Equation (29) where worst detection noise $w_1$ and worst system disturbance $w_2$ are added:

$$\left. \begin{array}{l} x = Ax + Bu + Ew2 \\ x_e = Cx + Nw_2 2 \\ z_E = Cx + Nw_2 \\ z = \begin{bmatrix} Q^{1/2} x \\ \hat{Q}^{1/2} x \\ R^{1/2} u \end{bmatrix} \\ y_e = xe + \alpha x_e \end{array} \right\} \tag{29}$$

to minimize an evaluation function of quadratic form given by Equation (30).

$$\int_{-\infty}^{\infty}(x^T Q x + u^T R u + x_e^T \hat{Q} x_e - \gamma^2 w^T w) dt \tag{30}$$

This is the reason why the control is called the $H_2$ control based on the time response. As also seen from Equation (30), the $H_\infty$ control is also closely related to the LQG control and it is found that it approaches the optimal solution of the LQG control as $\gamma$ approaches infinity. Thus, the setting of weights can be done using the same concept as in the conventional optimal control, and thus, a design can be achieved effectively succeeding the design technology of the conventional optimal control.

Figure 23:
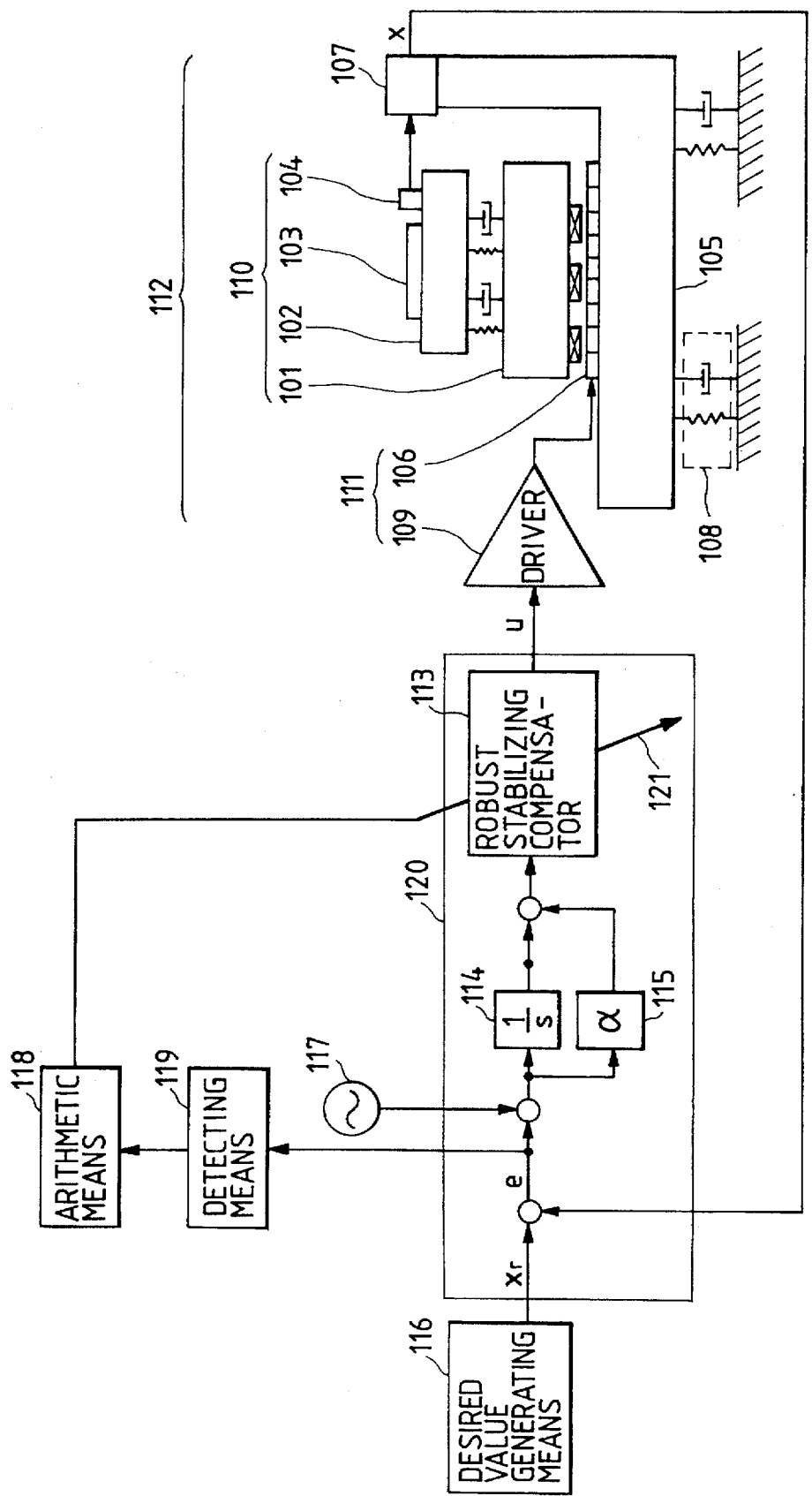
FIG. 23 is a structural drawing of a positioning apparatus for a stepper according to the third embodiment of the present invention.

Next described is a specific embodiment where the contents are applied to a positioning apparatus for a stepper using a linear motor. FIG. 23 shows a positioning control apparatus according to the third embodiment of the present invention, wherein references numeral 101 designates an XY stage, 102 denotes a fine movement stage, 103 denotes a wafer, 104 denotes a mirror, 105 denotes a vibration-proof table, 106 denotes a linear motor, 107 denotes a position measuring means utilizing a laser interferometer, 108 denotes a vibration-proof means for the vibration-proof table 105, 109 denotes a drive circuit, 110 denotes a body to be controlled, consisting of the XY stage 101, the fine movement stage 102, the wafer 103, and the mirror 104, 111 denotes a drive means consisting of the linear motor 106 and the drive circuit 109, 112 denotes a controlled object consisting of the body to be controlled 110, the drive means 111, and the position measuring means 107, 113 denotes a robust stabilizing compensator, 114 denotes an integrator, 115 denotes a proportional gain, 116 denotes a desired position producing means for the body to be controlled, 117 denotes a test signal generating means, 118 denotes an arithmetic means, 119 denotes a test output signal detecting means, 120 denotes a stabilizing compensation means for the controlled object 112, consisting of the robust stabilizing compensator 113, the integrator 114, and the proportional gain, and 121 denotes a parameter changing means for changing parameters of the stabilizing compensation means 120.

In the above structure, the XY stage 101 is moved in the XY directions by the drive means 111 to be positioned. The fine movement stage 102 is for correcting the inclination and the height of the surface of wafer 103 to be subjected to printing after completion of positioning by the drive means 111. A displacement x of the body to be controlled 110 is detected through a position of mirror 104 set on the fine movement stage 102, using the position detecting means 107 with the laser interferometer set on the vibration-proof table 105. Accordingly, the displacement x is a relative displacement between the vibration-proof table 105 and the body to be controlled 110. The desired value producing means 116 produces a desired value $x_r$ against the above relative displacement, and this desired value is sent to the stabilizing compensation means 120. Inside the stabilizing compensation means 120 a deviation e between the desired value $x_r$ and the actual relative displacement x is sent to the integrator 114 and to the proportional gain 115 and further is sent to the robust stabilizing compensator 113. Then an output from the robust stabilizing compensator 113 is sent to the drive means 111, where the signal is current-amplified, and the amplified signal is sent to the linear motor 106.

At the initial setting and on a periodic manner after that, the test signal generating means 117 generates a test signal to add it to the control system of the stepper. The test output signal for the test signal is detected by the test output signal detecting means 119 and the detected signal is sent to the arithmetic means 118. The arithmetic means 118 calculates the parameters of the stabilizing compensation means 120, based on this information, to automatically change the parameters of the stabilizing compensation means 120 by the parameter changing means 121. To get ready for the position dependence of characteristics of the controlled object, the arithmetic means 118 has parameters for a plurality of stabilizing compensation means 120 and changes over the parameters depending upon the displacement x. The above-described automatic adjustment procedures are used for this operation.

Figure 25A:
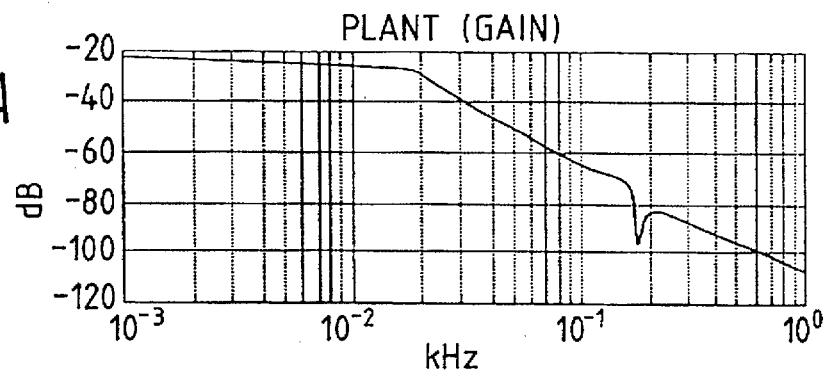
FIGS. 25A and 25B show the frequency response of a design model of a controlled object.
Figure 25B:
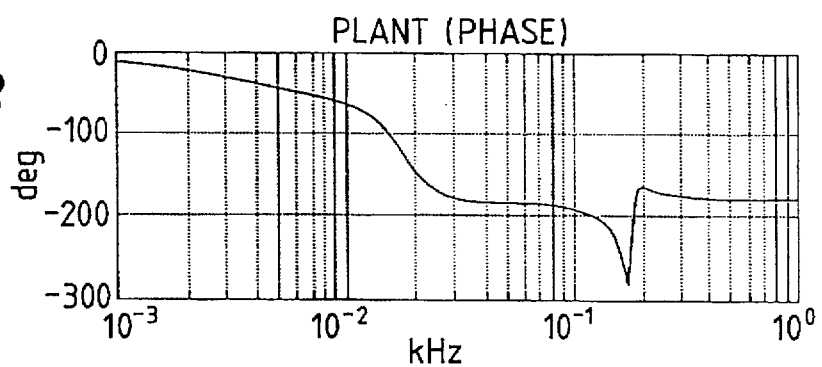

The functions of the arithmetic means 118 are next described. The arithmetic means 118 calculates the parameters of the stabilizing compensation means 120 based on the $H_\infty$ control taking the time response characteristics into account, as described previously, and for that purpose, the arithmetic means 118 needs to have a model of the controlled object 112. FIGS. 25A and 25B show the frequency response of the model of the controlled object 112 set in the arithmetic means 118, showing a kind of a lower-order design model considering the first-order oscillation mode of the fine movement stage 102, which will be a problem on positioning control, in order to design a stabilizing compensator of a necessary minimum order. In FIGS. 25A and 25B, the oscillation mode at about 16 Hz is the effect of the XY stage 101, and the oscillation mode at about 150 Hz is the effect by the fine movement stage 102, which will be a problem for positioning control.

Figure 26:
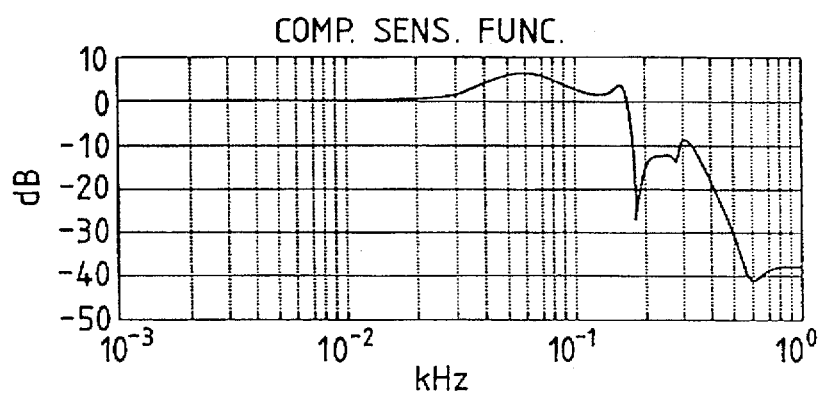
FIG. 26 shows a numerical analysis of frequency characteristics of a desired value response of the control system by the PID compensator.
Figure 27:
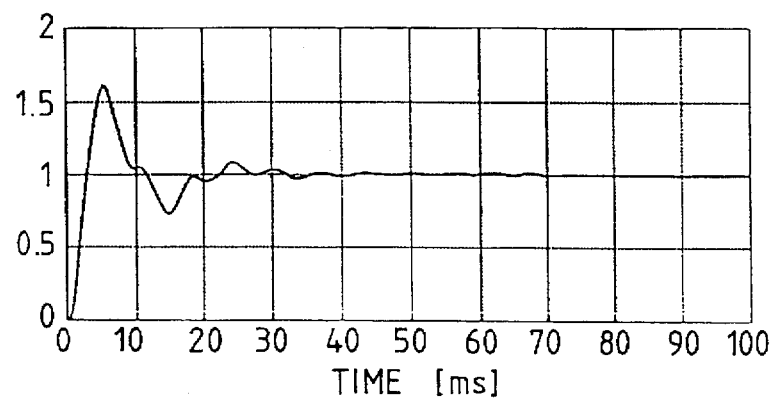
FIG. 27 shows the numerical analysis of a unit step response of the control system by the PID compensator.

In the positioning control of the stepper in the XY directions, the fine movement stage 102 can be deemed as a kind of oscillation load. The oscillation of this fine movement stage became a bottleneck in increasing the speed of control of the XY stage 101, which was a hindrance in achieving sufficient positioning performance in the control technology based on classical control, such as the PID compensator. FIG. 26 and FIG. 27 are frequency characteristics of a desired value response and a stage of unit step response in the conventional control technology using the PID compensator. In FIG. 26 and FIG. 27, the calculation is based on a higher-order simulation model for controlled object 112 constructed also taking higher-order modes of the fine movements stage into account in order to accurately calculate the behavior of an actual control system.

In FIG. 27, it is apparent that the oscillation of the fine movement stage 102 at about 150 Hz negatively affects the positioning characteristics. Clearly, an increase of speed due to a band shift of the servo system to higher bands is reciprocal to the stabilization of the servo system against higher-order resonance of the fine movement stage, and the speed increase was not sufficient using the conventional control technology. The effect of fine movement by the fine movement stage 102 appears outstanding as a peak at about 150 Hz also in the frequency response of FIG. 28.

Here, the oscillation mode to be a problem for the positioning control can be suppressed by the $H_\infty$ control technology using the conventional mixed sensitivity problem. However, such a technique provides a redundant compensator as compared with the controlled object 112, as described previously. When it is to be realized in a digital controller, and if the restriction on computation time is strict, it cannot be realized. Further, the time necessary for calculation of a compensator becomes longer so as to increase the time delay, thus causing a problem of affecting the stability of the control system. Additionally, another big problem was that the $H_\infty$ control technology using the conventional mixed sensitivity problem was not originally able to construct the type-one servo system. Thus, the present invention constructs the servo system, based on the $H_\infty$ control taking the time response characteristics into account as described above.

The functions of the arithmetic means 118 are specifically described as follows. In the arithmetic means 118 the generalized plant of FIG. 24 is constructed using the design model of controlled object 112 having the characteristics shown in FIGS. 25A and 25B to solve the standard $H_\infty$ control problem, thereby obtaining a desired stabilizing compensation means 120. Then, the parameters of the stabilizing compensation means 120 are sent to the parameter changing means 121 to update the stabilizing compensator 113 so as to have desired characteristics. At the initial setting, preliminarily tuned values are used as the constant weights as being design parameters. The constant weights at the initial setting, however are not always able to perfectly compensate for the robust stability against variations of characteristics due to device differences of the controlled object.

Since the model used for design is a low-order model taking account only of the first-order oscillation mode of the fine movement stage 102 for keeping the order of the compensator low, the control system with the compensator obtained actually using the model should be considered to have insufficient robust stability. Further, because errors with modeling are always present in fact, it is important in parameter setting to calculate the stabilizing compensator by automatic adjustment while finely adjusting the weights so that the control system has sufficient robustness.

Figure 28:
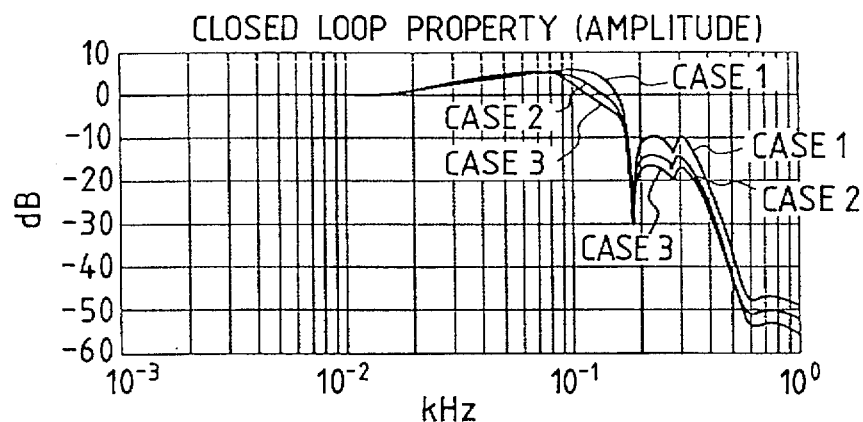
FIG. 28 shows a numerical analysis indicating the frequency characteristics of a desired value response with differences of weight on a control input.

In the present embodiment, the weight $R^{1/2}$ is adjusted for automatic adjustment. It is because the weight $R^{1/2}$ has a property to adjust the robust stability of the control system and the control system with higher robust stability can be constructed with greater $R^{1/2}$, as described previously. Accordingly, the test output signal from the test signal generating means is added to the control system, and using the test output signal obtained by the test output signal detecting means, the parameters of the stabilizing compensator are obtained by repetitive computations so as to obtain the desired robust stability. As a specific example of property changes of the control system using the repetitive computations, FIG. 28 shows numerical computations of the frequency response of desired value response characteristics with changes of $R^{1/2}$. In this simulation, the computations are based on the previously described simulation model.

The constant weights except for $R^{1/2}$ are those set at the initial setting without change. The robust stability becomes enhanced as $R^{1/2}$ increases. On the other hand, the quick-response property becomes degraded. Thus, an appropriate trade-off needs to be employed. In FIG. 28, the setting of case 1 shows an example of insufficient robust stability, and case 3 shows an example of the insufficient quick-response property. After several trials by automatic adjustment, the setting of case 2 resulted. Thus, if the weights are proper at the initial setting, the automatic adjustment after that needs only adjustment of the value of $R^{1/2}$, thereby enabling simple and practical adjustment. Changing the parameters of the stabilizing compensation means by the above automatic adjustment at the initial setting and with necessity after that, the stabilizing compensation means 120, a servo system having balanced robustness and stability can be realized even with characteristic variations of the controlled object 112 due to the long-term operation and the position dependence of characteristics as described previously. This is an effective operation of the present invention, which the conventional technology was unable to achieve.

Figure 29A:
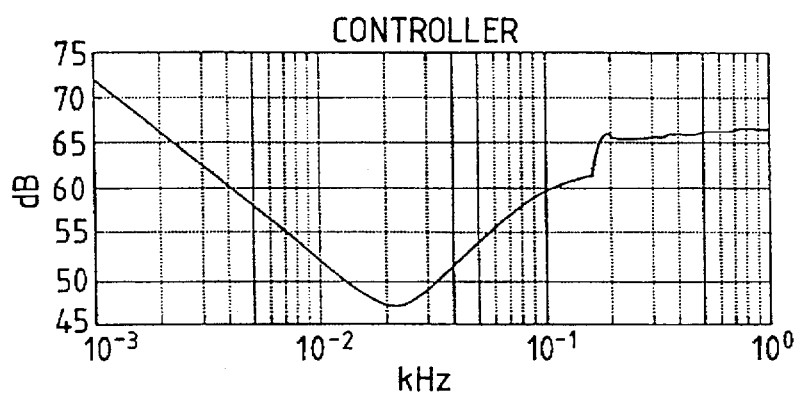
FIGS. 29A and 29B show the frequency response of a stabilizing compensation means of the $H_\infty$ control system taking the time response characteristics into account.
Figure 29B:
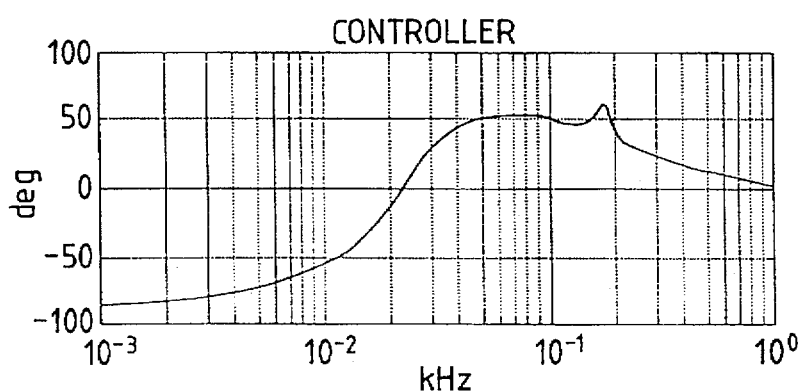

FIGS. 29A and 29B show the frequency response of the stabilizing compensation means 120 obtained at the above final weight setting. It is seen that the first-order oscillation mode of the fine movement stage 102, which will be a problem for control performance, is incorporated in the design model for the controlled object 112, whereby the notch filter for suppressing it is skillfully incorporated. Such compensator characteristics have never been achieved by the conventional PID control technology and are an effective operation of the present embodiment.

Figure 30:
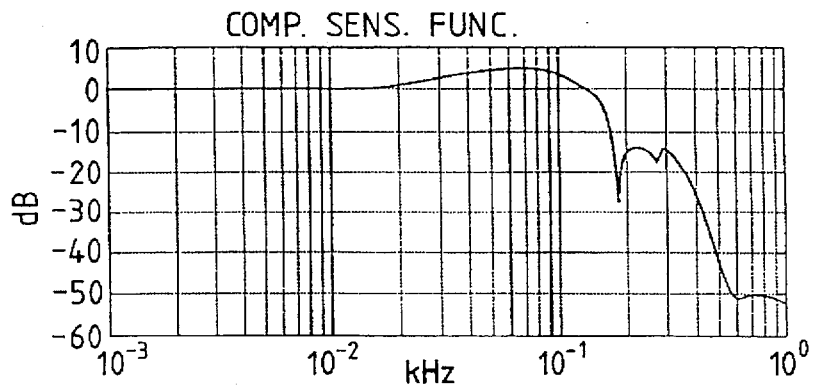
FIG. 30 shows a numerical analysis of the frequency characteristics of a desired value response of the $H_\infty$ control system taking the time response characteristics into account.
Figure 31:
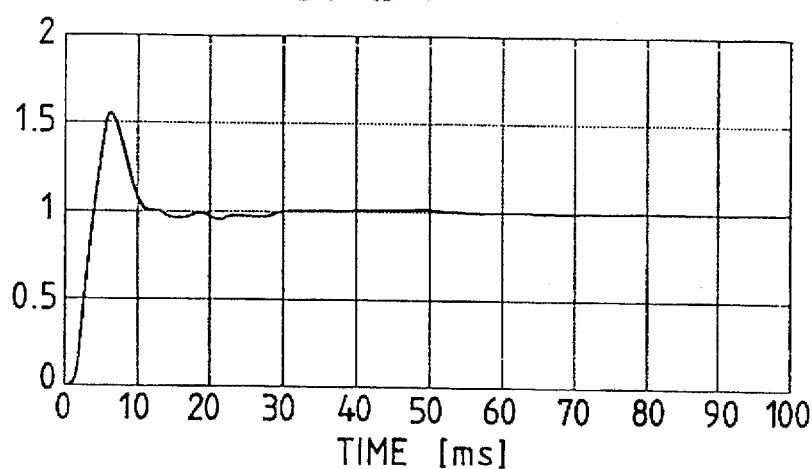
FIG. 31 shows the numerical analysis of a unit step response of the $H_\infty$ control taking the time response characteristics into account.

Next, the characteristics of the control system using the stabilizing compensation means 120 are calculated using a simulation model that also takes account of the resonance of higher-order modes of the fine movement stage 102 as also described previously. FIG. 30 shows frequency characteristics of a desired value response and FIG. 31 shows the unit step response. Compared with the control technology using the conventional PID compensator, as previously shown in FIG. 27 and FIG. 28, it is seen that the oscillation of the fine movement stage at about 150 Hz is suppressed.

Figure 32:
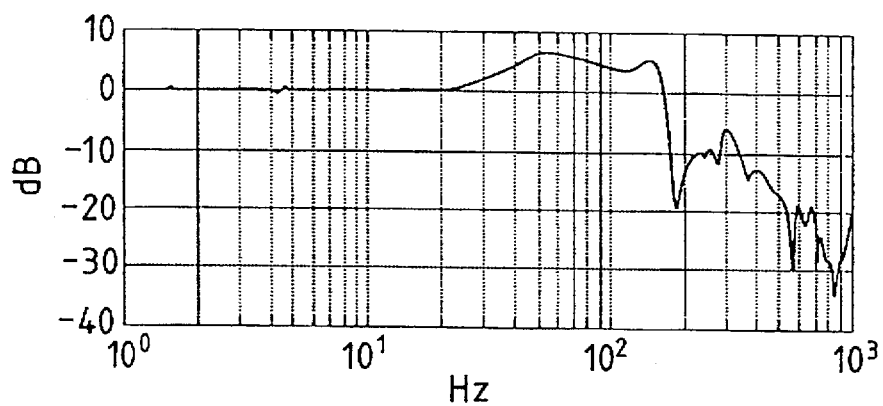
FIG. 32 shows measurement results of the frequency characteristics of a desired value response of the control system by the PID compensator.
Figure 33:
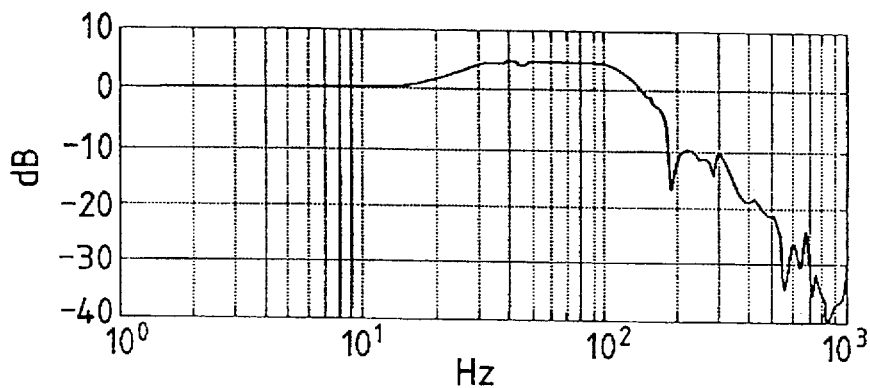
FIG. 33 shows the measurement results of the frequency characteristics of a desired value response of the $H_\infty$ control system taking the time response characteristics into account.
Figure 34:
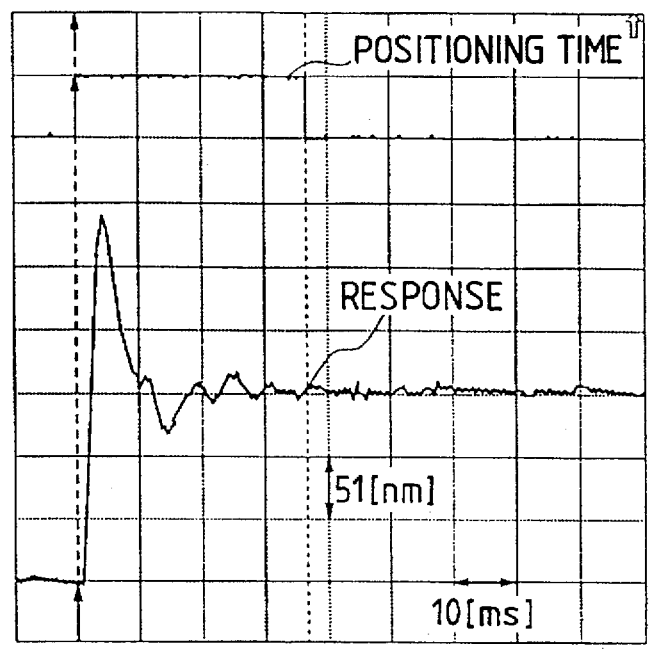
FIG. 34 shows the measurement results of a unit step response of the control system by the PID compensator.
Figure 35:
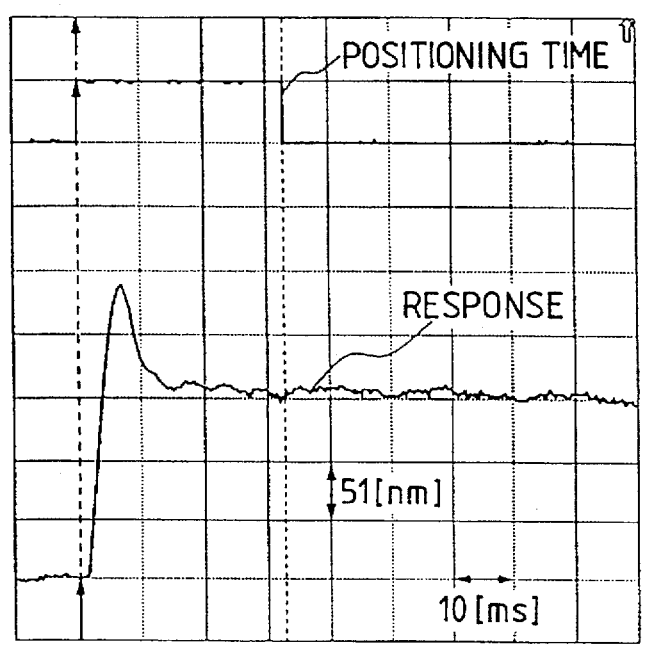
FIG. 35 shows the measurement results of a unit step response of the $H_\infty$ control system taking the time response characteristics into account.

The results of experiments actually using the stepper with the above stabilizing compensation means 120 are shown in comparison with the results using a conventional PID compensator. FIG. 32 shows the frequency response to the desired value response in the control technology using the conventional PID compensator, while FIG. 33 shows the frequency response of the desired value response by the stabilizing compensation means 120 of the present embodiment. For comparison of the response waveform and the positioning time in the unit step response, FIG. 34 shows experiment results in the control technology using the conventional PID compensator and FIG. 35 shows experiment results in the present invention. The comparison shows that the results are substantially the same as in the numerical analysis previously shown, and the positioning time is actually improved to be about 10% shorter. From the actual experiment results the control performance is clearly considerably improved.

Although all the above control apparatus as described the above embodiments are control apparatus for performing position control, the present invention can be applied not only to the position control but also to speed control of a body to be controlled. The speed control can be realized in the same manner by simply setting the speed as a state amount to be controlled. Thus, the present invention is effective for the constant-speed movement control of a robot. In many control apparatus arranged in such a manner that a body to be controlled is controlled up to near a desired position in a speed control mode and thereafter it is finally positioned in a precise position control mode, excellent effects can be achieved applying the techniques of the present invention to either of the speed control mode and the position control mode.

The effects of the embodiments as described above are summarized as follows.

(1) The automatic adjustment function enables the performing of control using an always optimum compensation means even for controlled objects including a potential problem of degradation of performance due to long-term operation. The parameters of the stabilizing compensation means are changed over depending upon the position of the controlled object, taking the position dependence of characteristics of the controlled object into account, whereby nonuniformity of the control performance depending upon the position can be overcome and stable control performance is achieved.

(2) The $H_\infty$ control theory using the normalized coprime factorization is applied from a completely new viewpoint of "succeeding the knowhow in the design technology of the classical control technology as it is", and the advantage of ease of adjustment with a smaller number of parameters as owned by the classical control technology is also realized in the control technology based on modern control theory. In addition, high-speed and high-accuracy control is easily achieved where there is an oscillation mode to become a problem for positioning performance in the control band, which was not achieved by the conventional classical control theory.

(3) The invention can overcome the problem of pole-zero cancellation between the controlled object and the compensator as occurring in the mixed sensitivity problem of the conventional $H_\infty$ control technology.

(4) The compensation means can be constructed without any problem for cases having the compensator which has never been realized by the mixed sensitivity problem of the conventional $H_\infty$ control technology and/or an integrator in the controlled object.

(5) Although it is the control technology performing the automatic adjustment, different from the control technology based on the conventional modern control theory, the maintainability of the control system can be maintained in any case and the control performance in the conventional classical control can be secured in any case.

(6) The $H_\infty$ control theory taking the time response characteristics into account is applied from a completely new viewpoint that it is advanced control technology optimal for automatic adjustment, whereby high-speed and high-accuracy control is readily achieved where there is an oscillation mode to become a problem for positioning performance in the control band, which conventional classical control theory failed to achieve. Then the invention realizes a stabilizing compensation means having a necessary minimum order, which the conventional $H_\infty$ control technology, represented by the mixed sensitivity problem failed, to achieve.

What is claimed is:

1. A control apparatus comprising:
   drive means for driving a body to be controlled;
   state observing means for observing a moving state of the body to be controlled and producing a state observation signal;
   desired value producing means for producing a state desired value for the body to be controlled;
   robust stabilizing compensation means for producing a control signal for said drive means from the state observation signal produced by said state observing means and the state desired value produced by said desired value producing means;

test signal generating means for generating and adding a test signal to a control system of said body to be controlled by said robust stabilizing compensation means;

test output signal detecting means for detecting the test signal;

arithmetic means for calculating a parameter of said robust stabilizing compensation means using the test signal; and parameter changing means for changing the parameter of said robust stabilizing compensation means, based on the calculation by said arithmetic means, wherein said robust stabilizing compensation means comprises a frequency shaping compensator and a robust compensator, wherein said arithmetic means calculates a model representing a dynamic behavior of a controlled object consisting of the body to be controlled, said driving means, and said state observing means, the controlled object comprising said frequency shaping compensator whereby the controlled object is a frequency-shaped controlled object; wherein said arithmetic means calculates a normalized coprime factorization for the frequency-shaped, controlled object; wherein said arithmetic means calculates an upper limit of an $H_\infty$ norm of variations of a numerator rational function and a denominator rational function in the normalized coprime factorization; wherein said arithmetic means designates a variation value smaller than the upper limit of the $H_\infty$ norm of said variations, based on the upper limit of the $H_\infty$ norm of said variations; and wherein said arithmetic means calculates a robust compensator based on the calculated normalized coprime factorization.

2. A control apparatus according to claim 1, wherein said frequency shaping compensator has a PID compensator.

3. A control apparatus according to claim 1, wherein the test signal produced by said test signal generating means is added to the control system of said body to be controlled and said arithmetic means calculates a parameter of said frequency shaping compensator using the test signal obtained by said test output signal detecting means.

4. A control apparatus according to claim 1, wherein said arithmetic means calculates or comprises said frequency-shaped, controlled object while preliminarily correcting a characteristic of said frequency shaping compensator for performing frequency shaping for the controlled object taking a characteristic of said robust compensator into account, and, based thereon, calculates the parameter of said robust stabilizing compensation means.

5. A control apparatus according to claim 1, wherein when said arithmetic means calculates the upper limit of the $H_\infty$ norm of variations of the numerator rational function and the denominator rational function in said normalized coprime factorization and designates the variation value of the $H_\infty$ norm smaller than the upper limit of the variations, based on the upper limit of the $H_\infty$ norm of variations, wherein said robust stabilizing compensation means is changed by said arithmetic means and said parameter changing means while designating the variation value; wherein the test signal produced by said test signal generating means is added to the control system of the body to be controlled by said robust stabilizing compensation means; wherein a) it is determined whether or not the control system has a permissible robust stability preliminarily set, using the test signal produced by said test signal output detecting means; wherein if the control system does not have the permissible robust stability, b) the variation value to be designated is changed until the permissible robust stability preliminarily set is attained, c) said robust stabilizing compensation means is again changed, and d) inspection of robust stability with the test signal is carried out, whereby a final robust stabilizing compensation means is determined by repeating steps a)–d) a plurality of times.

6. A control apparatus according to claim 5, wherein if a control system having the permissible robust stability cannot be constructed within a range of the permissible value of variations preliminarily set, said arithmetic means uses only said frequency shaping compensator to construct a series compensation element in the robust stabilizing compensation means.

7. A control apparatus according to claim 1, wherein when said arithmetic means calculates the upper limit of variations of the numerator rational function and the denominator rational function in said normalized coprime factorization, said arithmetic means uses only a frequency shaping compensator to construct a series compensation element in said robust stabilizing compensation means if the upper limit of the $H_\infty$ norm of variations thus calculated is smaller than a permissible value preliminarily set.

8. A control apparatus according to claim 1, wherein the model for the controlled object calculated by said arithmetic means is provided with information on an oscillation mode of the controlled object.

9. A control apparatus according to claim 1, wherein the parameter of said robust stabilizing compensation means is changed over.

10. A control apparatus comprising:

drive means for driving a body to be controlled;

state observing means for observing a moving state of the body to be controlled and producing a state observation signal;

desired value producing means for producing a state desired value for the body to be controlled;

robust stabilizing compensation means for producing a control signal for said drive means from the state observation signal produced by said state observing means and the state desired value produced by said desired value producing means;

test signal generating means for generating and adding a test signal to a control system of said body to be controlled by said robust stabilizing compensation means;

test output signal detecting means for detecting the test signal;

arithmetic means for calculating a parameter of said robust stabilizing compensation means using the test signal; and parameter changing means for changing the parameter of said robust stabilizing compensation means, based on the calculation by said arithmetic means, wherein said arithmetic means has a model for a controlled object consisting of said body to be controlled, said drive means, and said state observing means; wherein an integrator and a proportional gain are connected in parallel to an observation output terminal of a state-space model of said controlled object; wherein a sum of an output from said integrator and an output from said proportional gain is set as a state observation output of an expanded, generalized plant in a standard $H_\infty$ problem; wherein products of the output from said integrator, an internal state amount of the state-space model of said controlled object, and a control input of said state-space model by respectively proper constant weight matrices are set as control outputs of said expanded, generalized plant; wherein a set of products of a first derivative of the internal state amount of the state-space model and an observation output from the state-space model of said controlled object by respectively proper weight functions is set as an exogenous input of said expanded, generalized plant; wherein a robust stabilizing compensator is calculated so as to minimize a $H_\infty$ norm of from the exogenous input of said expanded, generalized plant to the control outputs of said expanded, generalized plant and to stabilize said expanded, generalized plant; and wherein the parameter of said robust stabilizing compensation means for said controlled object is calculated by a robust compensator, said integrator, and the proportional gain.

11. A control apparatus according to claim 10, wherein said arithmetic means designates a constant weight; wherein said arithmetic means obtains a stabilizing compensator to minimize the $H_\infty$ norm in said generalized plant; wherein said arithmetic means changes said robust stabilizing compensation means by said parameter changing means; wherein the test signal produced by said test signal generating means is added to the control system for said controlled object by said robust stabilizing compensation means; wherein a) it is determined whether or not the control system has a permissible robust stability preliminarily set, using the test signal from said test signal output detecting means; wherein if the control system does not have the permissible robust stability, b) the constant weight to be designated is changed until said permissible robust stability preliminarily set is attained, c) said robust stabilizing compensation means is again changed, and d) inspection of robust stability with the test signal is carried out, whereby a final robust stabilizing compensation means is determined by repeating steps a)–d) a plurality of times.

12. A control apparatus according to claim 11, wherein the model for the controlled object calculated by said arithmetic means is provided with information on an oscillation mode of the controlled object.

13. A control apparatus according to claim 11, wherein the parameter of said robust stabilizing compensation means is changed over depending upon a displacement of the controlled object.

14. A stage apparatus comprising:
a stage; and
a control apparatus controlling said stage, comprising:
  drive means for driving said stage;
  state observing means for observing a moving state of said stage and producing a state observation signal;
  desired value producing means for producing a state desired value for said stage;
  robust stabilizing compensation means for producing a control signal for said drive means from the state observation signal produced by said state observing means and the state desired value produced by said desired value producing means;
  test signal generating means for generating and adding a test signal to a control system of said stage by said robust stabilizing compensation means;
  test output signal detecting means for detecting the test signal;
  arithmetic means for calculating a parameter of said robust stabilizing compensation means using the test signal; and
  parameter changing means for changing the parameter of said robust stabilizing compensation means, based on the calculation by said arithmetic means, wherein said robust stabilizing compensation means comprises a frequency shaping compensator and a robust compensator, wherein said arithmetic means calculates a model representing a dynamic behavior of a controlled object consisting of said stage, said driving means, and said state observing means, the controlled object comprising said frequency shaping compensator whereby the controlled object is a frequency-shaped controlled object; wherein said arithmetic means calculates a normalized coprime factorization for the frequency-shaped, controlled object; wherein said arithmetic means calculates an upper limit of an $H_\infty$ norm of variations of a numerator rational function and a denominator rational function in the normalized coprime factorization; wherein said arithmetic means designates a variation value smaller than the upper limit of the $H_\infty$ norm of said variations, based on the upper limit of the $H_\infty$ norm of said variations; and wherein said arithmetic means calculates a robust compensator based on the calculated normalized coprime factorization.

15. A hard disk servo writer apparatus comprising:
a writing head; and
a control apparatus controlling the writing head, comprising:
  drive means for driving said writing head;
  state observing means for observing a moving state of said writing head and producing a state observation signal;
  desired value producing means for producing a state desired value for said writing head;
  robust stabilizing compensation means for producing a control signal for said drive means from the state observation signal produced by said state observing means and the state desired value produced by said desired value producing means;
  test signal generating means for generating and adding a test signal to a control system of said writing head by said robust stabilizing compensation means;
  test output signal detecting means for detecting the test signal;
  arithmetic means for calculating a parameter of said robust stabilizing compensation means using the test signal; and
  parameter changing means for changing the parameter of said robust stabilizing compensation means, based on the calculation by said arithmetic means, wherein said robust stabilizing compensation means comprises a frequency shaping compensator and a robust compensator, wherein said arithmetic means calculates a model representing a dynamic behavior of a controlled object consisting of said writing head, said driving means, and said state observing means, the controlled object comprising said frequency shaping compensator whereby the controlled object is a frequency-shaped controlled object; wherein said arithmetic means calculates a normalized coprime factorization for the frequency-shaped, controlled object; wherein said arithmetic means calculates an upper limit of an $H_\infty$ norm of variations of a numerator rational function and a denominator rational function in the normalized coprime factorization; wherein said arithmetic means designates a variation value smaller than the upper limit of the $H_\infty$ norm of said variations, based on the upper limit of the $H_\infty$ norm of said variations; and wherein said arithmetic means calculates a robust compensator based on the calculated normalized coprime factorization.

16. A stage apparatus comprising:
   a stage; and
   a control apparatus controlling said stage, comprising:
   drive means for driving said stage;
   state observing means for observing a moving state of the body to be controlled and producing a state observation signal;
   desired value producing means for producing a state desired value for said stage;
   robust stabilizing compensation means for producing a control signal for said drive means from the state observation signal produced by said state observing means and the state desired value produced by said desired value producing means;
   test signal generating means for generating and adding a test signal to a control system of said stage by said robust stabilizing compensation means;
   test output signal detecting means for detecting the test signal;
   arithmetic means for calculating a parameter of said robust stabilizing compensation means using the test signal; and
   parameter changing means for changing the parameter of said robust stabilizing compensation means, based on the calculation by said arithmetic means, wherein said arithmetic means has a model for a controlled object consisting of said Stage, said drive means, and said state observing means; wherein an integrator and a proportional gain are connected in parallel to an observation output terminal of a state-space model of said controlled object; wherein a sum of an output from said integrator and an output from said proportional gain is set as a state observation output of an expanded, generalized plant in a standard $H_\infty$ problem; wherein products of the output from said integrator, an internal state amount of the state-space model of said controlled object, and a control input of said state-space model by respectively proper constant weight matrices are set as control outputs of said expanded, generalized plant; wherein a set of products of a first derivative of the internal state amount of the state-space model and an observation output from the state-space model of said controlled object by respectively proper weight functions is set as an exogenous input of said expanded, generalized plant; wherein a robust stabilizing compensator is calculated so as to minimize a $H_\infty$ norm of from the exogenous input of said expanded, generalized plant to the control outputs of said expanded, generalized plant and to stabilize said expanded, generalized plant; and wherein the parameter of said robust stabilizing compensation means for said controlled object is calculated by a robust compensator, said integrator, and the proportional gain.

17. A hard disk servowriter apparatus, comprising:
   a writing head; and
   a control apparatus controlling said writing head, comprising:
   drive means for driving said writing head;
   state observing means for observing a moving state of said writing head and producing a state observation signal;
   desired value producing means for producing a state desired value for said writing head;
   robust stabilizing compensation means for producing a control signal for said drive means from the state observation signal produced by said state observing means and the state desired value produced by said desired value producing means;
   test signal generating means for generating and adding a test signal to a control system of said writing head by said robust stabilizing compensation means;
   test output signal detecting means for detecting the test signal;
   arithmetic means for calculating a parameter of said robust stabilizing compensation means using the test signal; and
   parameter changing means for changing the parameter of said robust stabilizing compensation means, based on the calculation by said arithmetic means, wherein said arithmetic means has a model for a controlled object consisting of said writing head, said drive means, and said state observing means; wherein an integrator and a proportional gain are connected in parallel to an observation output terminal of a state-space model of said controlled object; wherein a sum of an output from said integrator and an output from said proportional gain is set as a state observation output of an expanded, generalized plant in a standard $H_\infty$ problem; wherein products of the output from said integrator, an internal state amount of the state-space model of said controlled object, and a control input of said state-space model by respectively proper constant weight matrices are set as control outputs of said expanded, generalized plant; wherein a set of products of a first derivative of the internal state amount of the state-space model and an observation output from the state-space model of said controlled object by respectively proper weight functions is set as an exogenous input of said expanded, generalized plant; wherein a robust stabilizing compensator is calculated so as to minimize a $H_\infty$ norm of from the exogenous input of said expanded, generalized plant to the control outputs of said expanded, generalized plant and to stabilize said expanded, generalized plant; and wherein the parameter of said robust stabilizing compensation means for said controlled object is calculated by a robust compensator, said integrator, and the proportional gain.

* * * * *

UNITED STATES PATENT AND TRADEMARK OFFICE
CERTIFICATE OF CORRECTION

PATENT NO. : 5,726,879
DATED : March 10, 1998
INVENTOR(S) : MIKIO SATO

Page 1 of 3

It is certified that error appears in the above-identified patent and that said Letters Patent is hereby corrected as shown below:

COLUMN 12

Line 39, "of very" should read --of the very--.
Lines 56-58, "$(A-BS^{-1}D^TC)^TX+X(A-BS^{-1}D^TC)+XBS^{-1}B^TX+C^TR^{-1}C=0 \ (A-BD^TR^{-1}C)Z+Z(A-BD^TR^{-1}C)^T+ZC^TR^{-1}CZ+BS^{-1}B^T=0R=I+DD^T, S=I+D^TD$" should read $$--(A-BS^{-1}D^TC)^TX+X(A-BS^{-1}D^TC)+XBS^{-1}B^TX+C^TR^{-1}C=0$$

$$(A-BD^TR^{-1}C)Z+Z(A-BD^TR^{-1}C)^T+ZC^TR^{-1}CZ+BS^{-1}B^T=0$$

$$R=I+DD^T, \ S=I+D^TD--.$$

COLUMN 14

Line 42, "that" should read --than--.

COLUMN 15

Line 54, "degradiation" should read --degradation--.

COLUMN 16

Line 3, "$(\gamma^2-1)^{\frac{1}{2}}|P_s(j\omega)|$" should read --$(\gamma^2-1)^{\frac{1}{2}}+|P_s(j\omega)|$--.
Line 15, "of apparatus" should read --of the apparatus--.
Line 16, "designated" should read --designates--.

UNITED STATES PATENT AND TRADEMARK OFFICE
CERTIFICATE OF CORRECTION

PATENT NO. : 5,726,879
DATED : March 10, 1998
INVENTOR(S) : MIKIO SATO

It is certified that error appears in the above-identified patent and that said Letters Patent is hereby corrected as shown below:

COLUMN 18

Line 52, "wa" should read --was--.

COLUMN 19

Line 41, "limited" should read --limit--.

COLUMN 21

Line 13, "Int he" should read --In the--.

COLUMN 24

Line 37, "references" should read --reference--.

COLUMN 27

Line 57, "described" should read --described in--.

COLUMN 28

Line 54, "failed," should read --failed--.

UNITED STATES PATENT AND TRADEMARK OFFICE
CERTIFICATE OF CORRECTION

PATENT NO.   : 5,726,879

DATED        : March 10, 1998

INVENTOR(S) : MIKIO SATO

It is certified that error appears in the above-identified patent and that said Letters Patent is hereby corrected as shown below:

COLUMN 33

Line 31, "Stage" should read --stage--.

Signed and Sealed this

Fourth Day of May, 1999

Q. TODD DICKINSON

Attest:

Attesting Officer

Acting Commissioner of Patents and Trademarks